United States Patent
Yoshikawa

(10) Patent No.: US 11,402,262 B2
(45) Date of Patent: Aug. 2, 2022

(54) PHOTOELECTRIC CONVERSION DEVICE

(71) Applicant: KANEKA CORPORATION, Osaka (JP)

(72) Inventor: Kunta Yoshikawa, Settsu (JP)

(73) Assignee: KANEKA CORPORATION, Osaka (JP)

( * ) Notice: Subject to any disclaimer, the term of this patent is extended or adjusted under 35 U.S.C. 154(b) by 199 days.

(21) Appl. No.: 16/809,521

(22) Filed: Mar. 4, 2020

(65) Prior Publication Data
US 2020/0200600 A1 Jun. 25, 2020

Related U.S. Application Data

(63) Continuation of application No. PCT/JP2018/035030, filed on Sep. 21, 2018.

(51) Int. Cl.
*G01J 1/42* (2006.01)
*H01L 31/0224* (2006.01)
*H01L 31/105* (2006.01)

(52) U.S. Cl.
CPC .... *G01J 1/4257* (2013.01); *H01L 31/022475* (2013.01); *H01L 31/1055* (2013.01); *G01J 2001/4247* (2013.01)

(58) Field of Classification Search
CPC ............ G01J 1/4257; G01J 2001/4247; H01L 31/1055; H01L 31/0232; H01L 31/10
See application file for complete search history.

(56) References Cited

U.S. PATENT DOCUMENTS

| | | | |
|---|---|---|---|
| 4,366,377 A | 12/1982 | Notthoff et al. | |
| 4,926,036 A | 5/1990 | Maeda | |

(Continued)

FOREIGN PATENT DOCUMENTS

| | | | |
|---|---|---|---|
| EP | 3 171 406 A1 | 5/2017 | |
| JP | S61-069170 A | 4/1986 | |

(Continued)

OTHER PUBLICATIONS

International Search Report issued in PCT/JP2018/020773; dated Jun. 26, 2018. International Preliminary Report on Patentability; PCT/JP2018/020773; dated Mar. 17, 2020. Translation of Written Opinion of the International Searching Authority; PCT/JP2018/020773; dated Jun. 26, 2018.

(Continued)

*Primary Examiner* — Sitaramarao S Yechuri
(74) *Attorney, Agent, or Firm* — Studebaker & Brackett PC

(57) ABSTRACT

A photoelectric conversion device for detecting the spot size of incident light, includes a photoelectric conversion element having a photoelectric conversion substrate with two main surfaces, and first and second sensitivity section sections; and scanners that relatively scan incident light on the main surfaces of the photoelectric conversion element. When a sensitivity region on a main surface of the first sensitivity section is defined as a first sensitivity region and sensitivity regions that appear on a main surface of the second sensitivity sections are defined as second sensitivity regions, the first sensitivity region receives at least part of the light incident on the main surface during scanning, and has a pattern in which, in accordance with enlargement of an irradiation region irradiated with incident light on the main surface, the proportion of the first sensitivity region with respect to the second sensitivity regions in the irradiation region is decreased.

13 Claims, 13 Drawing Sheets

(56) References Cited

U.S. PATENT DOCUMENTS

| | | | | |
|---|---|---|---|---|
| 5,825,071 | A | * | 10/1998 | Takakura ............ H01L 27/1446 257/440 |
| 6,372,531 | B1 | | 4/2002 | Fujii |
| 2001/0007501 | A1 | | 7/2001 | Frojdh |
| 2006/0044545 | A1 | * | 3/2006 | Horn ........................ G01C 3/08 356/4.01 |
| 2015/0340402 | A1 | | 11/2015 | Yamanaka et al. |

FOREIGN PATENT DOCUMENTS

| | | | |
|---|---|---|---|
| JP | S63-151085 A | | 6/1988 |
| JP | 01266770 A | * | 10/1989 |
| JP | H01-266770 A | | 10/1989 |
| JP | H02-062921 A | | 3/1990 |
| JP | H02-072415 U | | 6/1990 |
| JP | H06-20160 B2 | | 3/1994 |
| JP | H08-018093 A | | 1/1996 |
| JP | 2001-284632 A | | 10/2001 |
| JP | 2002-367218 A | | 12/2002 |
| JP | 2005-209294 A | | 8/2005 |
| JP | 2009-244164 A | | 10/2009 |
| JP | 2014-107446 A | | 6/2014 |
| JP | 6093061 B2 | | 3/2017 |
| WO | 2011/013172 A1 | | 2/2011 |

OTHER PUBLICATIONS

The extended European search report issued by the European Patent Office dated Apr. 22, 2020, which corresponds to European Patent Application No. 18855750.8-1230 and is related to U.S. Appl. No. 16/809,521.

An Office Action issued by the United States Patent and Trademark Office dated Feb. 23, 2021, which corresponds tc U.S. Appl. No. 16/809,521 and is related to U.S. Appl. No. 16/809,521.

International Search Report issued in PCT/JP2018/035030; dated Nov. 6, 2018.

* cited by examiner

PHOTOELECTRIC CONVERSION DEVICE

CROSS-REFERENCE TO RELATED APPLICATIONS

This application claims benefit of priority to International Patent Application No. PCT/JP2018/035030, filed Sep. 21, 2018, and to Japanese Patent Application No. 2017-220400, filed Nov. 15, 2017, the entire contents of each are incorporated herein by reference.

BACKGROUND

Technical Field

The present disclosure relates to a photoelectric conversion device used in the field of light detection or the like.

Background Art

Japanese Patent No. 6093061 discloses a photoelectric conversion element (semiconductor light receiving element) for detecting the intensity (illuminance) of incident light. An element using a crystalline silicon substrate is, for example, known as such a photoelectric conversion element. In the photoelectric conversion element using the crystalline silicon substrate, a dark current is relatively small and an S/N ratio is relatively high and sensitivity is high (stable response without depending on illuminance) even if the intensity of incident light is low.

SUMMARY

There is a demand for a photoelectric conversion device capable of detecting the spot size of incident light.

Accordingly, the present disclosure provides a photoelectric conversion device for detecting the spot size of incident light.

A photoelectric conversion device according to the present disclosure includes a photoelectric conversion element including a photoelectric conversion substrate having two principal surfaces, and including a first sensitive part and a second sensitive part, and a scanning unit for relatively scanning the principal surface of the photoelectric conversion element with incident light. When a sensitive region appearing on the principal surface of the first sensitive part is defined as a first sensitive region and a sensitive region appearing on the principal surface of the second sensitive part is defined as a second sensitive region, the first sensitive region receives, during scanning by the scanning unit, at least a portion of incident light incident on the principal surface and forms a pattern for decreasing a ratio of the first sensitive region to the second sensitive region in an irradiation region as the irradiation region irradiated with the incident light on the principal surface increases.

According to the present disclosure, it is possible to provide a photoelectric conversion device for detecting the spot size of incident light.

DETAILED DESCRIPTION

Embodiments of the present disclosure will be described with reference to the accompanying drawings below. Same or corresponding parts shall be denoted by the same reference numbers in each drawing. For the sake of convenience, hatching, member reference numbers, etc. may be omitted. However, in such cases, other drawings shall be referred to.

First Embodiment

Figure 1:
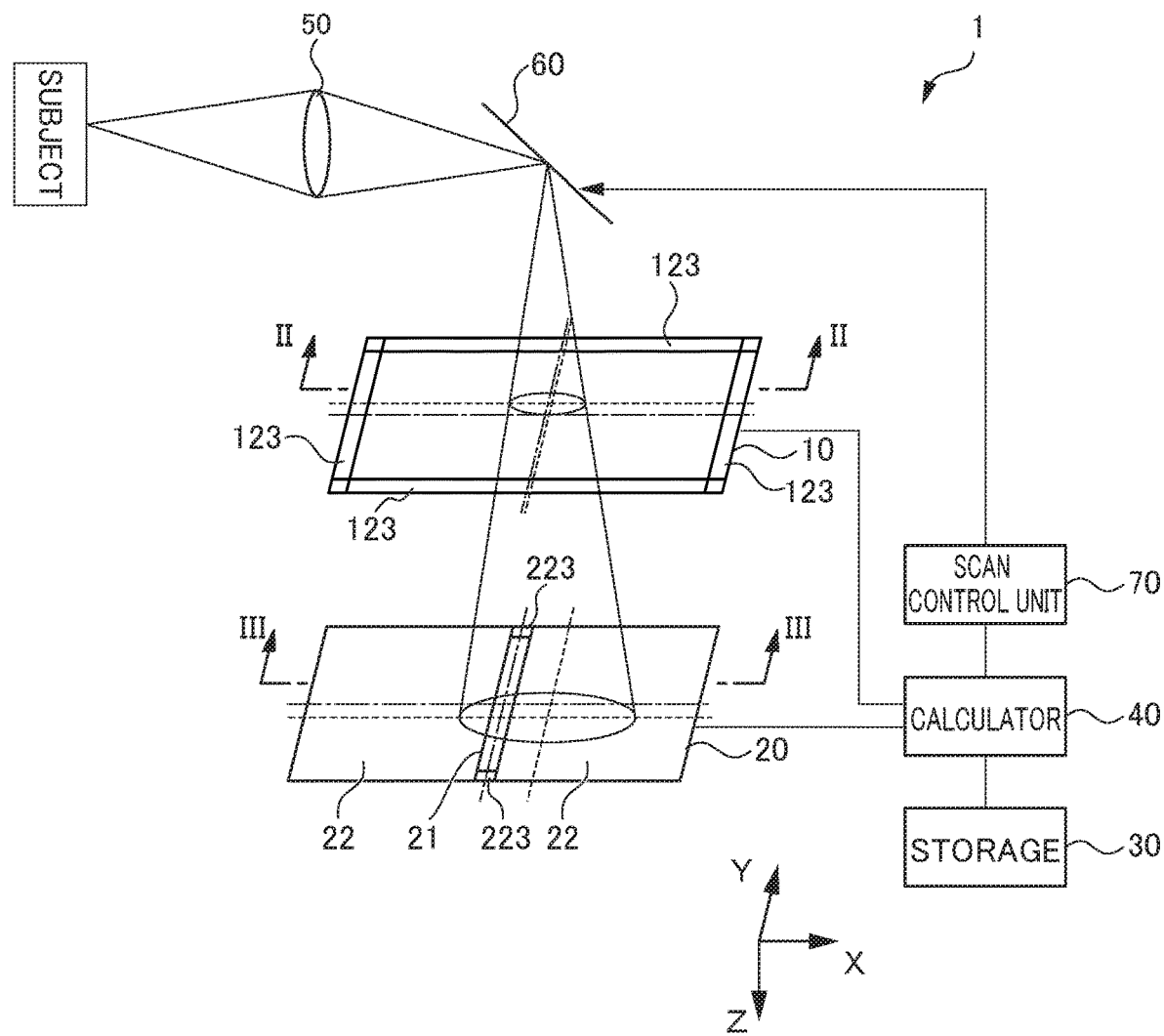
FIG. 1 is a view showing the configuration of a photoelectric conversion device (three-dimensional sensor) according to a first embodiment.

FIG. 1 is a view showing the configuration of a photoelectric conversion device according to a first embodiment. The photoelectric conversion device 1 shown in FIG. 1 includes an optical lens 50 for condensing an optical image (diffused light) emitted from a subject, for example, by irradiating laser light to the subject, a scan mirror 60 for changing the direction of condensed light from the optical lens 50, and a scan control unit 70 for controlling the scan operation of the scan mirror 60. The photoelectric conversion device 1 includes a first photoelectric conversion element 10 arranged on an upstream side in a light propagation direction from the scan mirror 60, a second photoelectric conversion element 20 arranged on a downstream side in the light propagation direction, a storage 30 and a calculator 40.

An XYZ orthogonal coordinate system is shown in FIG. 1 and figures to be described later. An XY plane is a plane parallel to light receiving surfaces of the first photoelectric conversion element 10 and the second photoelectric conversion element 20 (and a photoelectric conversion element 20A according to a second embodiment) and a Z direction is a direction orthogonal to the XY plane.

In FIG. 1 and the figures to be described later, an intersection of two dashed-dotted lines in a plan view indicates a center of the XY plane; one dashed-dotted line is parallel to an X direction and the other dashed-dotted line is parallel to a Y direction. An intersection of two dotted lines in the plan view indicates a center of the spot size of incident light on the XY plane; one dotted line is parallel to the X direction and the other dotted line is parallel to the Y direction.

The photoelectric conversion device 1 shown in FIG. 1 has a function for detecting the spot size of incident light, and is suitably applicable to an optical sensor such as a three-dimensional sensor. For example, the three-dimensional sensor detects a position in a Z direction (depth) (i.e. a distance in the Z direction) in addition to positions in X and Y directions (XY position) of a subject by causing diffused light from the subject to be incident thereon. In such a three-dimensional sensor, if the position of the subject in the Z direction (depth) changes, the spot size of incident light incident on a photoelectric conversion element inside changes (defocusing). Accordingly, if the photoelectric conversion device 1 according to this embodiment is applied to such a three-dimensional sensor, the position (a distance in the Z direction) of the subject in the Z direction (depth) can be detected by detecting the spot size of incident light incident on the photoelectric conversion element. The three-dimensional position of the subject can be detected from the XY position of the subject (or an incident direction of the incident light) and the position (a distance in the Z direction) in the Z direction (depth). Each component of the photoelectric conversion device 1 is described below.

The scan mirror 60 has a drive unit such as a motor, and changes the direction of condensed light from the optical lens 50 by the control of the scan control unit 70. The scan control unit 70 controls the scan mirror 60, and scans the light receiving surface of the second photoelectric conversion element 20 with incident light in such a way that the incident light moves back and forth in the X direction on the light receiving surface of the second photoelectric conversion element 20. The function and operation of the scan control unit 70 will be described in detail later.

The first photoelectric conversion element 10 generates a current corresponding to the intensity (total amount) of incident light incident on the light receiving surface. The first photoelectric conversion element 10 distributes and outputs the generated current to four electrode layers 123 (and electrode layers 133 on a back surface side to be described later) arranged on four sides according to a center position (coordinates) (hereinafter, also referred to as an XY position) of the incident light on the light receiving surface (XY plane). The first photoelectric conversion element 10 also transmits the incident light. The configuration of the first photoelectric conversion element 10 is described in detail later.

The second photoelectric conversion element 20 generates a current corresponding to the intensity of the incident light incident on a high-sensitive part 21 (to be described in detail later). In this way, the second photoelectric conversion element 20 generates a current corresponding to the density of the incident light, i.e. a current corresponding to the spot size of the incident light (to be described in detail later). The second photoelectric conversion element 20 distributes and outputs the generated current to two electrode layers 223 (and electrode layers 233 on a back surface side to be described later) arranged on two opposite sides according to a center position (coordinates) (hereinafter, also referred to as an XY position) of the incident light on the light receiving surface (XY plane). The configuration of the second photoelectric conversion element 20 is described in detail later.

The storage 30 stores in advance a table associating an output current (total amount) of the first photoelectric conversion element 10 (i.e. the intensity (total amount) of incident light on the first photoelectric conversion element 10) and an output current (total amount) of the second photoelectric conversion element 20 (i.e. the intensity of the incident light on the high-sensitive part of the second photoelectric conversion element 20) with the spot size of the incident light on the light receiving surface of the second photoelectric conversion element 20, and further associating the position (i.e. a distance in the Z direction) of the subject in the Z direction (depth) with this spot size. The storage 30 is a rewritable memory such as an EEPROM.

The calculator 40 calculates and detects the intensity (total amount) of the incident light according to the total amount of currents output from the four electrode layers 123 (133) of the first photoelectric conversion element 10.

The calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10. The calculator 40 also calculates and detects the XY position (coordinates) of the incident light on the light receiving surface of the second photoelectric conversion element 20 based on time-series data on currents output from the two electrode layers 223 (233) of the second photoelectric conversion element 20 when the light receiving surface of the second photoelectric conversion element 20 is scanned with the incident light by the scan control unit 70. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four electrode layers 123 (133) of the first photoelectric conversion element 10 (i.e. the intensity (total amount) of the incident light on the first photoelectric conversion element 10) and the total amount of the maximum currents output from the two electrode layers 223 (233) of the second photoelectric conversion element 20 during scanning by the scan control unit 70 (i.e. the intensity of the incident light on the high-sensitive part of the second photoelectric conversion element 20), and the position (a distance in the Z direction) of the subject in the Z direction (depth). The calculator 40 detects the three-dimensional position of the subject from the incident direction of the incident light detected as described above and the position (i.e. a distance in the Z direction) in the Z direction (depth). The function and operation of the calculator 40 will be described in detail later.

The scan control unit 70 and the calculator 40 are each constituted by an arithmetic processor such as a DSP (Digital Signal Processor) or an FPGA (Field-Programmable Gate Array). Various functions of the scan control unit 70 and the calculator 40 are realized, for example, by executing a predetermined software (program, application) stored in the storage 30. Various functions of the scan control unit 70 and the calculator 40 may be realized by the cooperation of a hardware and a software or may be realized only by a hardware (electronic circuit). The configurations of the first photoelectric conversion element 10 and the second photoelectric conversion element 20, and the functions and operations of the scan control unit 70 and the calculator 40 are described in detail below in order.

<Configuration of First Photoelectric Conversion Element>

Figure 2:
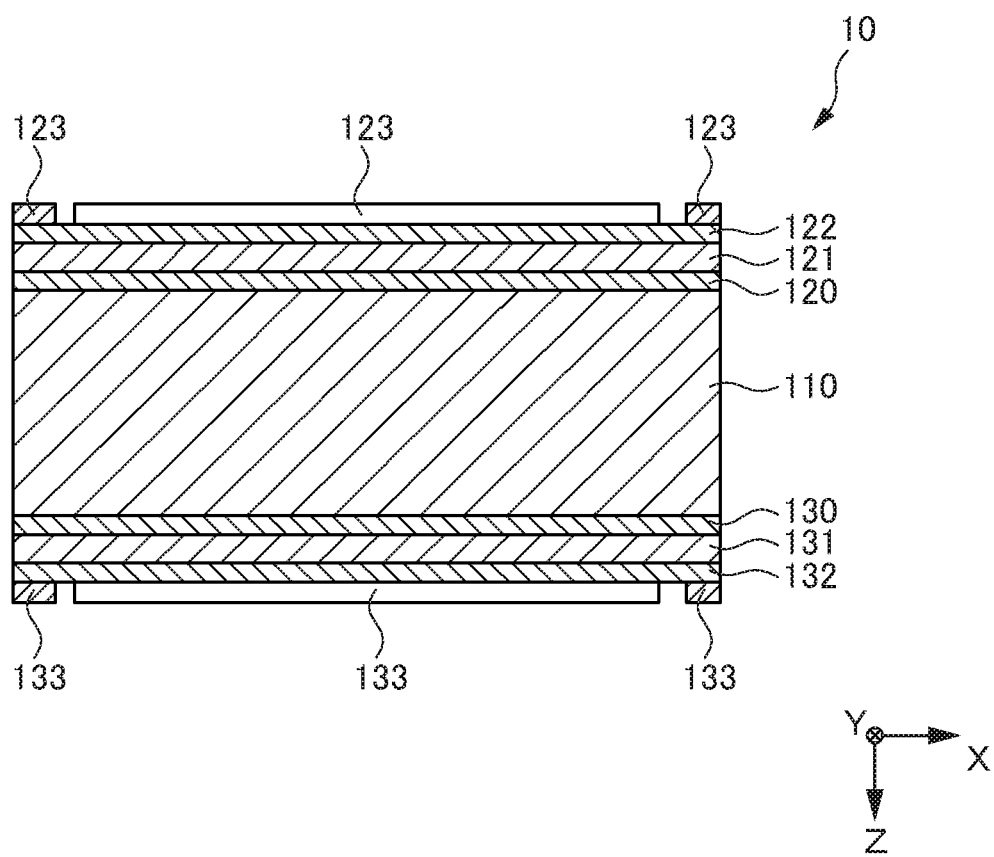
FIG. 2 is a sectional view along line II-II in a first photoelectric conversion element of FIG. 1.

FIG. 2 is a sectional view along line II-II of the first photoelectric conversion element 10 of FIG. 1. The first photoelectric conversion element 10 is provided with an n-type (second conductivity type) semiconductor substrate (photoelectric conversion substrate) 110 having two principal surfaces, and a passivation layer 120, a p-type (first conductivity type) semiconductor layer 121, a transparent electrode layer 122 and the electrode layers 123 successively laminated on the light receiving surface side, which is one principal surface on a light receiving side, out of the principal surfaces of the semiconductor substrate 110. The first photoelectric conversion element 10 is also provided with a passivation layer 130, an n-type (second conductivity type) semiconductor layer 131, a transparent electrode layer 132 and the electrode layers 133 successively laminated on a part of a back surface side, which is the other principal surface on a side opposite to the light receiving side, out of the principal surfaces of the semiconductor substrate 110.

The semiconductor substrate (photoelectric conversion substrate) 110 is formed of a crystalline silicon material such as single-crystal silicon or multi-crystal silicon. The semiconductor substrate 110 is, for example, an n-type semiconductor substrate in which the crystalline silicon material is doped with an n-type dopant. An example of the n-type dopant may include phosphorus (P). By using the crystalline silicon as the material of the semiconductor substrate 110, a dark current is relatively small, and an S/N ratio is relatively high and sensitivity is high (stable response without depending on illuminance) even if the intensity of the incident light is low.

The passivation layer 120 is formed on the light receiving surface side of the semiconductor substrate 110, and the passivation layer 130 is formed on the back surface side of the semiconductor substrate 110. The passivation layers 120, 130 are, for example, formed of an intrinsic (i-type) amorphous silicon material. The passivation layers 120, 130 suppress the recombination of carriers generated in the semiconductor substrate 210 and enhance carrier recovery efficiency.

The p-type semiconductor layer 121 is formed on the passivation layer 120. The p-type semiconductor layer 121 is, for example, formed of an amorphous silicon material. The p-type semiconductor layer 121 is, for example, a p-type semiconductor layer in which the amorphous silicon material is doped with a p-type dopant. An example of the p-type dopant may include boron (B).

The n-type semiconductor layer 131 is formed on the passivation layer 130. The n-type semiconductor layer 131 is, for example, formed of an amorphous silicon material.

The n-type semiconductor layer 131 is, for example, an n-type semiconductor layer in which the amorphous silicon material is doped with an n-type dopant (e.g. phosphorus (P) described above). The aforementioned passivation layers 120, 130, p-type semiconductor layer 121 and n-type semiconductor layer 131 are formed, for example, using a CVD method.

The transparent electrode layer 122 is formed on the p-type semiconductor layer 121, and the transparent electrode layer 132 is formed on the n-type semiconductor layer 131. The transparent electrode layers 122, 132 are formed of a transparent conductive material. ITO (Indium Tin Oxide: complex oxide of indium oxide and tin oxide) or the like is given as an example of the transparent conductive material. The transparent electrode layers 122, 132 are formed, for example, using a sputtering method.

Four electrode layers 123 are independently formed on the respective four sides on the transparent electrode layer 122, and four electrode layers 133 are independently formed on the respective four sides on the transparent electrode layer 132. The electrode layers 123, 133 are formed of a conductive paste material containing metal powder such as silver powder. The electrode layers 123, 133 are formed, for example, using a printing method.

<Configuration of Second Photoelectric Conversion Element>

Figure 3:
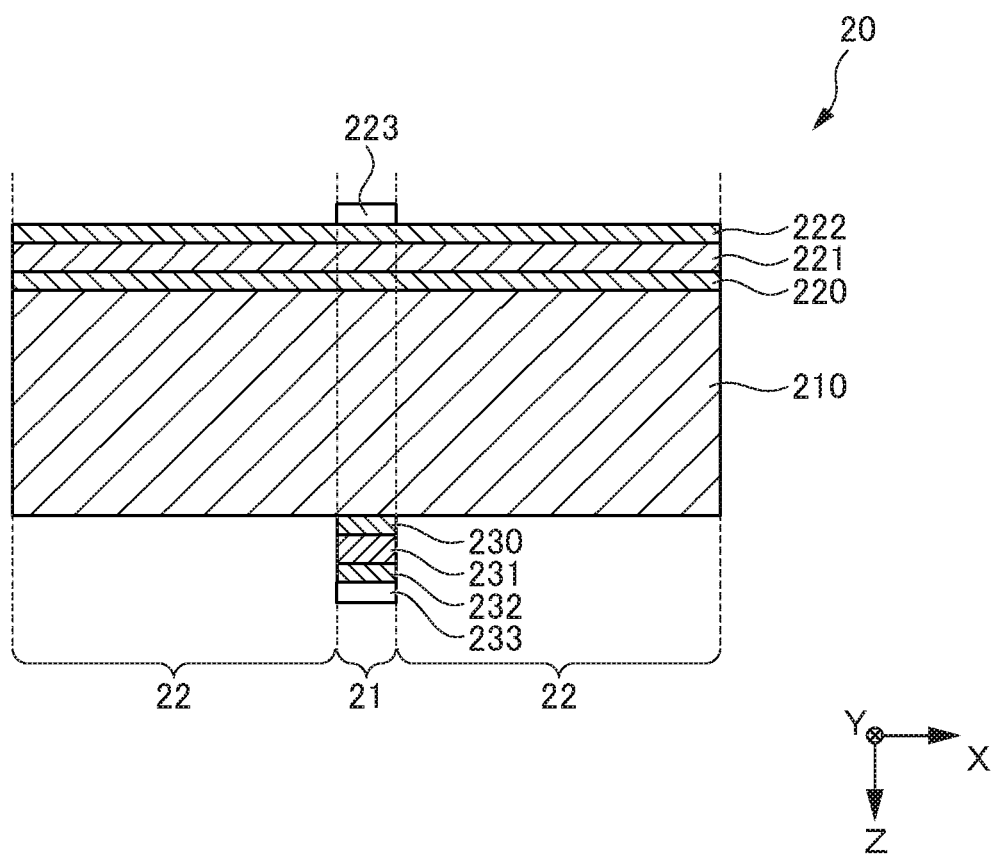
FIG. 3 is a sectional view along line in a second photoelectric conversion element of FIG. 1.

FIG. 3 is a sectional view along line of the second photoelectric conversion element 20 of FIG. 1. The second photoelectric conversion element 20 is provided with an n-type (second conductivity type) semiconductor substrate (photoelectric conversion substrate) 210 having two principal surfaces, and a passivation layer 220, a p-type (first conductivity type) semiconductor layer 221, a transparent electrode layer 222 and the electrode layers 223 successively laminated on the light receiving surface side, which is one principal surface on a light receiving side, out of the principal surfaces of the semiconductor substrate 210. The second photoelectric conversion element 20 is also provided with a passivation layer 230, an n-type (second conductivity type) semiconductor layer 231, a transparent electrode layer 232 and the electrode layers 233 successively laminated in a specific region on a back surface side, which is the other principal surface on a side opposite to the light receiving surface, out of the principal surfaces of the semiconductor substrate 210.

A laminated part in this specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a high-sensitive part 21, and laminated parts other than in the specific region are referred to as low-sensitive parts 22.

The semiconductor substrate (photoelectric conversion substrate) 210 is formed of a crystalline silicon material such as single-crystal silicon or multi-crystal silicon similarly to the semiconductor substrate 110 of the aforementioned first photoelectric conversion element 10. The semiconductor substrate 210 is, for example, an n-type semiconductor substrate in which the crystalline silicon material is doped with an n-type dopant (e.g. phosphorus (P) described above). By using the crystalline silicon as the material of the semiconductor substrate 210, a dark current is relatively small, and an S/N ratio is relatively high and sensitivity is high (stable response without depending on illuminance) even if the intensity of the incident light is low.

The passivation layer 220 is formed in both the high-sensitive part 21 and the low-sensitive parts 22 on the light receiving surface side of the semiconductor substrate 210, and the passivation layer 230 is formed only in the high-sensitive part 21 on the back surface side of the semiconductor substrate 210. The passivation layers 220, 230 are, for example, formed of an intrinsic (i-type) amorphous silicon material similarly to the passivation layers 120, 130 of the aforementioned first photoelectric conversion element 10. The passivation layers 220, 230 suppress the recombination of carriers generated in the high-sensitive part 21 of the semiconductor substrate 210 and enhance carrier recovery efficiency.

The p-type semiconductor layer 221 is formed on the passivation layer 220, i.e. in both the high-sensitive part 21 and the low-sensitive parts 22 on the light receiving surface side of the semiconductor substrate 210. The p-type semiconductor layer 221 is, for example, formed of an amorphous silicon material similarly to the p-type semiconductor layer 121 of the aforementioned first photoelectric conversion element 10. The p-type semiconductor layer 221 is, for example, a p-type semiconductor layer in which the amorphous silicon material is doped with a p-type dopant (e.g. boron (B) described above).

The n-type semiconductor layer 231 is formed on the passivation layer 230, i.e. only in the high-sensitive part 21 on the back surface side of the semiconductor layer 210. The n-type semiconductor layer 231 is, for example, formed of an amorphous silicon material similarly to the n-type semiconductor layer 131 of the aforementioned first photoelectric conversion element 10. The n-type semiconductor layer 231 is, for example, an n-type semiconductor layer in which the amorphous silicon material is doped with an n-type dopant (e.g. phosphorus (P) described above). The aforementioned passivation layers 220, 230, p-type semiconductor layer 221 and n-type semiconductor layer 231 are formed, for example, using a CVD method.

The transparent electrode layer 222 is formed on the p-type semiconductor layer 221, i.e. in both the high-sensitive part 21 and the low-sensitive parts 22 on the light receiving surface side of the semiconductor substrate 210, and the transparent electrode layer 232 is formed on the n-type semiconductor layer 231, i.e. only in the high-sensitive part 21 on the back surface side of the semiconductor substrate 210. The transparent electrode layers 222, 232 are formed of a transparent conductive material similarly to the transparent electrode layers 122, 132 of the aforementioned first photoelectric conversion element 10. The transparent electrode layers 222, 232 are formed, for example, using a sputtering method.

Two electrode layers 223 are independently formed on the respective two opposite sides on the transparent electrode layer 222, and two electrode layers 233 are independently formed on the respective two opposite sides on the transparent electrode layer 232. The electrode layers 223, 233 are formed of a conductive paste material containing metal powder such as silver powder, similarly to the electrode layers 123, 133 of the aforementioned first photoelectric conversion element 10. The electrode layers 223, 233 are formed, for example, using a printing method.

Figure 4:
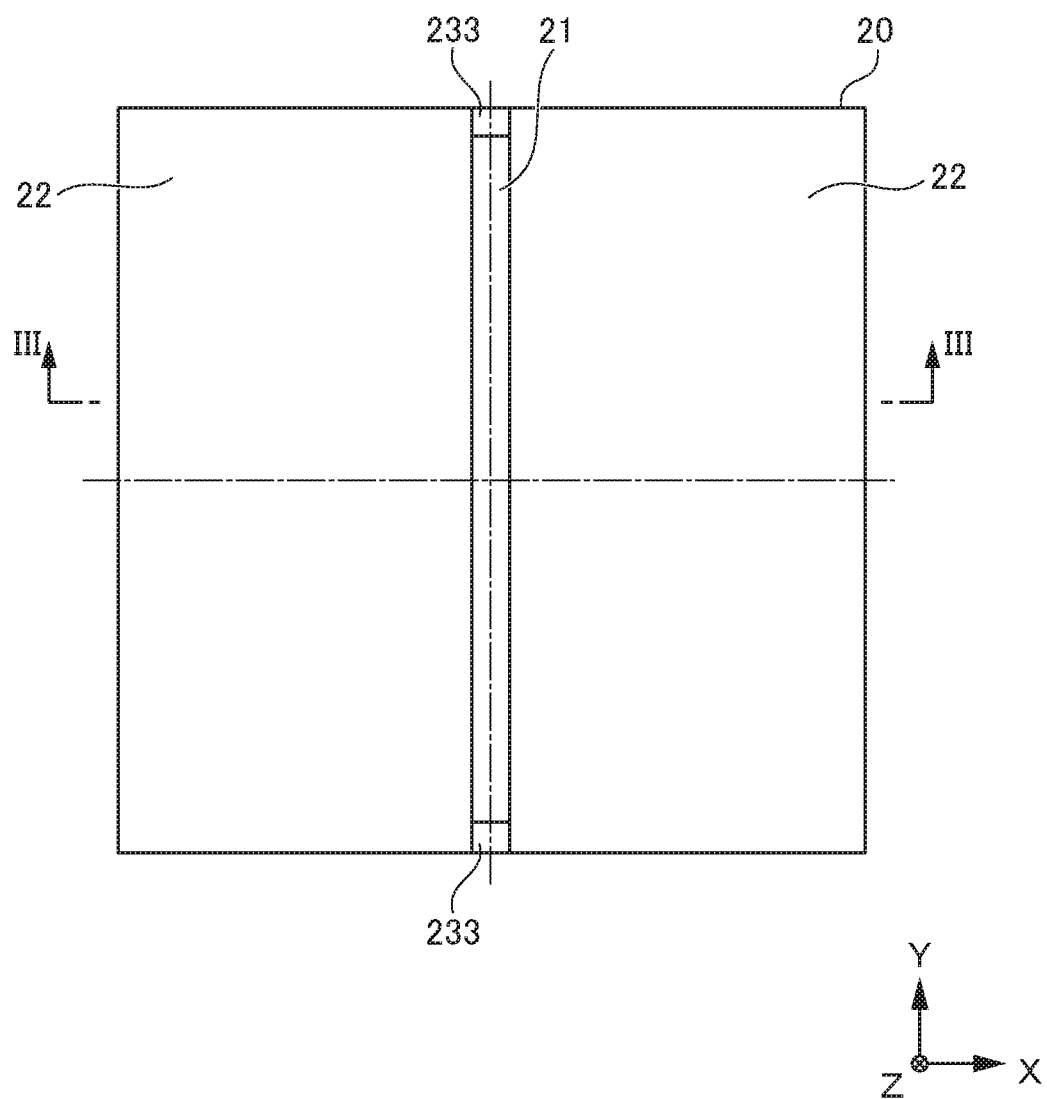
FIG. 4 is a view showing layers on the back surface side of a semiconductor substrate of the second photoelectric conversion element of FIGS. 1 and 3 from the light receiving surface side.

FIG. 4 is a view showing the layers 230, 231, 232, 233 on the back surface side of the semiconductor substrate 210 of the second photoelectric conversion element 20 of FIGS. 1 and 3 from the light receiving surface side. As shown in FIGS. 3 and 4, the second photoelectric conversion element 20 has the high-sensitive part (first sensitive part) 21 and the low-sensitive parts (second sensitive parts) 22. Sensitive regions appearing on the both principal surfaces (light receiving surface and back surface) of the semiconductor substrate 210 in the high-sensitive part 21 are high-sensitive regions (first sensitive regions), and sensitive regions appearing on the both principal surfaces of the semiconductor substrate 210 in the low-sensitive parts 22 are low-sensitive regions (second sensitive regions).

In the high-sensitive part 21, the passivation layers 220, 230, the conductivity type semiconductor layers 221, 231 and the transparent electrode layers 222, 232 are formed on the light receiving surface side and the back surface side of the semiconductor substrate 210 as described with reference to FIG. 3. On the other hand, in the low-sensitive parts 22, the passivation layer 230, the n-type semiconductor layer 231 and the transparent electrode layer 232 are not formed on the back surface side of the semiconductor substrate 210.

In other words, the passivation layer 220, the conductivity type semiconductor layer 221 and the transparent electrode layer 222 are formed in the high-sensitive region on the light receiving surface side of the high-sensitive part 21 and in the low-sensitive regions on the light receiving surface sides of the low-sensitive parts 22, and the passivation layer 230, the n-type semiconductor layer 231 and the transparent electrode layer 232 are formed in the high-sensitive region on the back surface side of the high-sensitive part 21. On the other hand, the passivation layer 230, the n-type semiconductor layer 231 and the transparent electrode layer 232 are not formed in the low-sensitive regions on the back surface sides of the low-sensitive parts 22.

Since the passivation layers 220, 230 are formed on the light receiving surface side and the back surface side in the high-sensitive part 21, the recombination of carriers generated in the high-sensitive part 21 of the semiconductor substrate 210 is suppressed and a life time of the carriers is relatively long. Thus, carrier recovery efficiency is relatively high and photoelectric conversion efficiency is relatively high in the high-sensitive part 21. On the other hand, since the passivation layer 230 is not formed on the back surface side in the low-sensitive parts 22, the recombination of carriers generated in the low-sensitive parts 22 of the semiconductor substrate 210 is not suppressed and the life time of the carriers is relatively short. Thus, carrier recovery efficiency is relatively low and photoelectric conversion efficiency is relatively low in the low-sensitive parts 22. In this embodiment, since neither the n-type semiconductor layer 231 nor the transparent electrode layer 232 is formed on the back surface sides of the low-sensitive parts 22, photoelectric conversion efficiency is nearly zero. In this application, "low sensitivity" shall include zero photoelectric conversion efficiency. As just described, the life time of the carrier differs and carrier recovery efficiency differs accordingly in the high-sensitive part 21 and the low-sensitive parts 22. As a result, photoelectric conversion efficiency (i.e. sensitivity) differs.

On the light receiving surface side of the low-sensitive part 22, the passivation layer 220, the p-type semiconductor layer 221 and the transparent electrode layer 222 are formed to be continuous with each of the passivation layer 220, the p-type semiconductor layer 221 and the transparent electrode layer 222 on the light receiving surface side of the high-sensitive part 21. Thus, optical characteristics (e.g. reflection characteristic) become uniform on the light receiving surface side.

Figure 5:
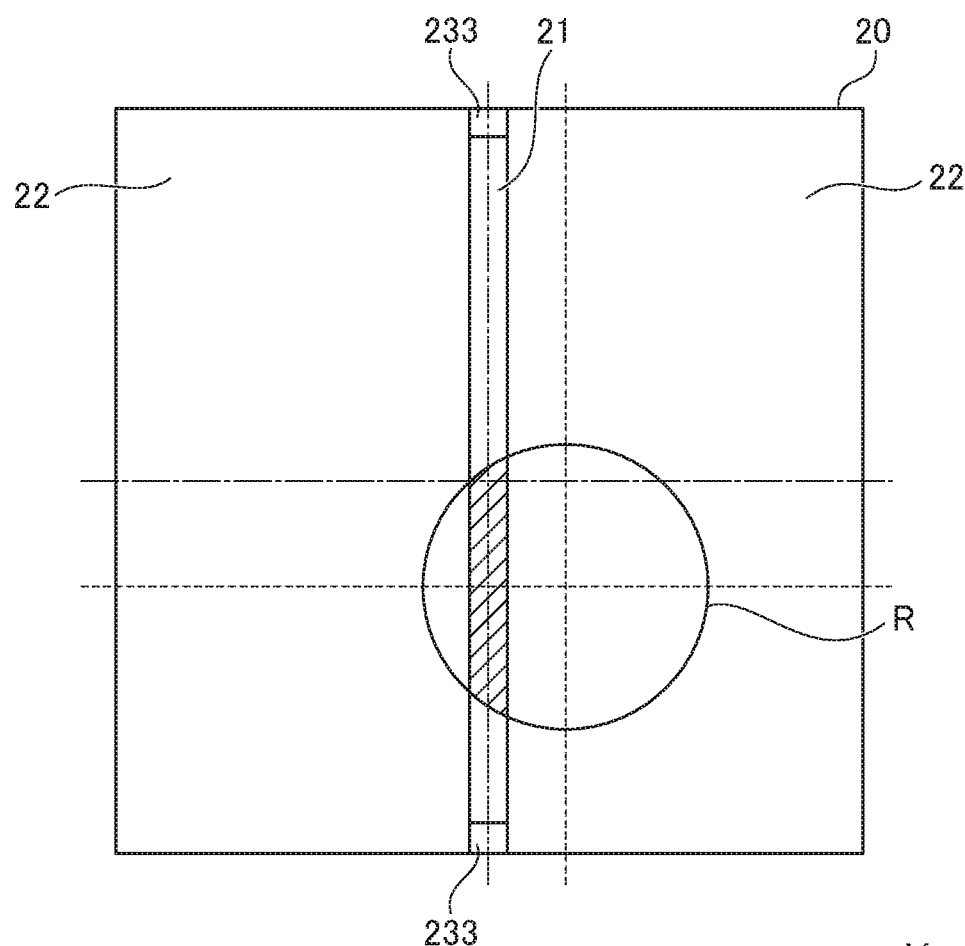
FIG. 5 is a view showing a state where incident light is incident on the second photoelectric conversion element of FIG. 4.
Figure 5:
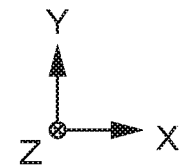

The high-sensitive region on the back surface side of the high-sensitive part 21 forms strip-like patterns passing through the center of the light receiving surface and extending in the Y direction. The strip-like patterns in the high-sensitive region on the back surface side of the high-sensitive part 21 have a constant width. Thus, as the irradiation region R irradiated with the incident light on the light receiving surface increases (i.e. as the density of the incident light decreases) as shown in FIG. 5, a ratio of the high-sensitive part 21 (high-sensitive region) to the low-sensitive parts 22 (low-sensitive regions) in the irradiation region R becomes smaller. Therefore, an output current decreases as the spot size of the incident light on the light receiving surface increases.

Figure 6:
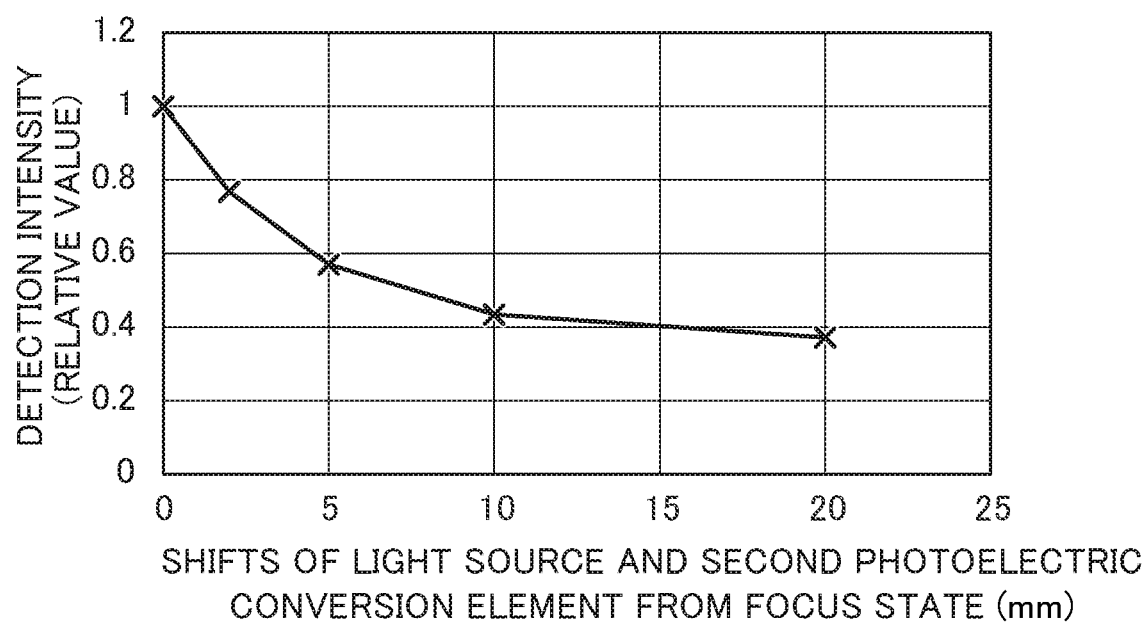
FIG. 6 is a graph showing an example of detection intensities (relative values) of the incident light with the second photoelectric conversion element when a light source is moved away from the second photoelectric conversion element from a state where the incident light from the light source is focused on the light receiving surface of the second photoelectric conversion element (0 mm on a horizontal axis)

FIG. 6 is a graph showing an example of detection intensities (relative values) of incident light with the second photoelectric conversion element 20 when the light source is moved away from the second photoelectric conversion element 20 from a state where the incident light (wavelength of 940 nm) from the light source is focused on the light receiving surface of the second photoelectric conversion element 20 (0 mm on a horizontal axis). FIG. 6 shows a characteristic when the high-sensitive region of the high-sensitive part 21 forms a strip-like pattern passing through the center of the light receiving surface and extending in the Y direction as shown in FIG. 4 and the width thereof is 0.5 mm According to FIG. 6, it is understood that detection intensities of the incident light with the second photoelectric conversion element 20 decrease as the light source is moved away from the second photoelectric conversion element 20, i.e. as the spot size of the incident light on the light receiving surface of the second photoelectric conversion element 20 increases.

<Functions and Operations of Scan Control Unit and Calculator>

Figure 7:
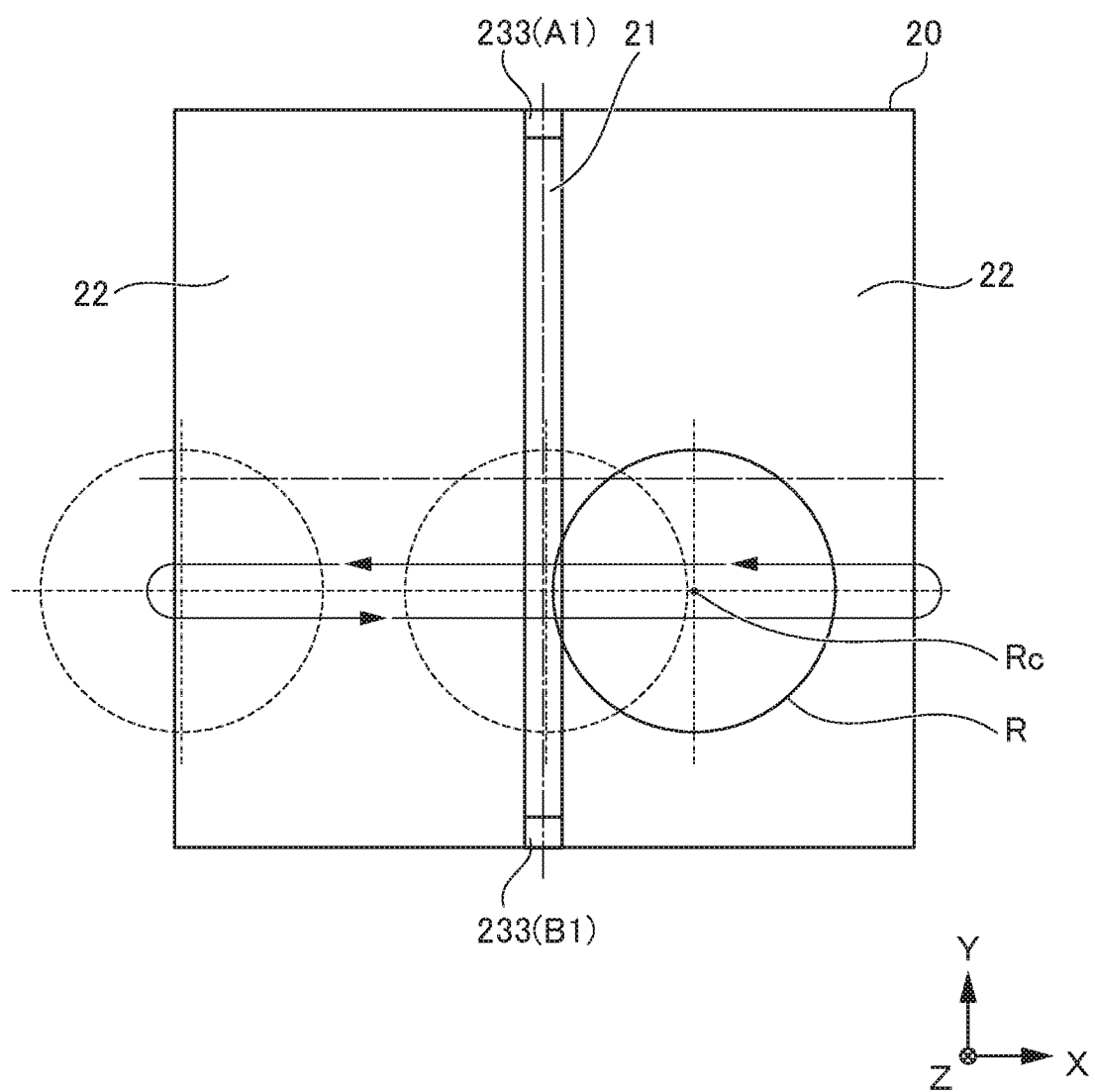
FIG. 7 is a schematic view of scanning of the light receiving surface of the second photoelectric conversion element with the incident light by a scan control unit in FIG. 1.

The scan control unit 70 controls the scan mirror 60, and scans the light receiving surface of the second photoelectric conversion element 20 with incident light in such a way that the incident light moves back and forth in the X direction, i.e. in a direction (arrow direction) longitudinally intersecting the strip-like pattern of the high-sensitive part 21 on the light receiving surface of the second photoelectric conversion element 20 as shown in FIG. 7. In this instance, the calculator 40 obtains time-series data on currents output from two pairs of the electrode layers 223, 233 of the second photoelectric conversion element 20. The obtained data may be temporarily stored in, for example, the storage 30.

Figure 8A:
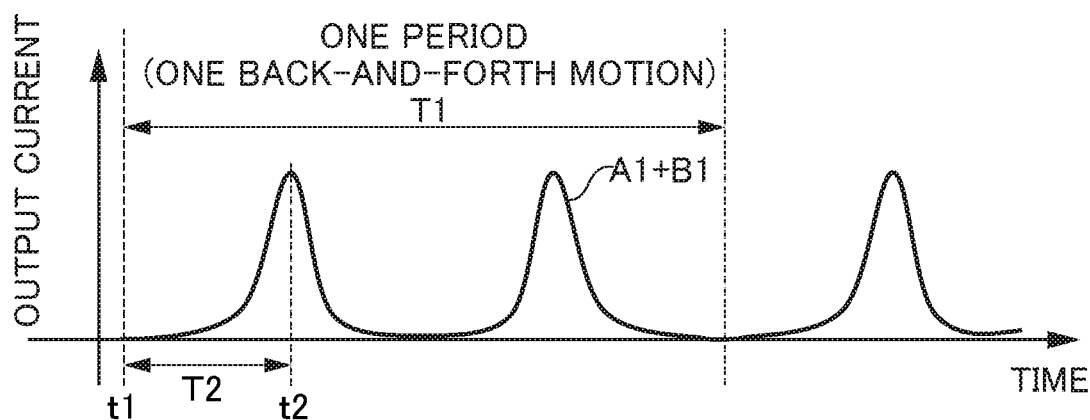
FIG. 8A is a schematic view of time-series data on a total amount A 1+B1 of output currents of two pairs of the electrode layers of the second photoelectric conversion element during scanning in FIG. 7.
Figure 8B:
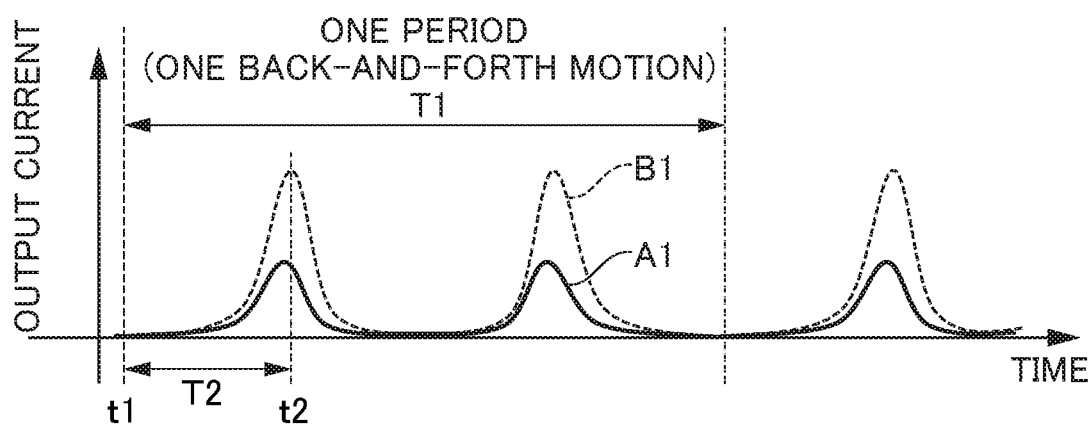
FIG. 8B is a schematic view of time-series data on output currents A1, B1 of each of two pairs of electrode layers of the second photoelectric conversion element during scanning in FIG. 7.

For example, output currents of two pairs of the electrode layers 223, 233 of the second photoelectric conversion element 20 are referred to as A1, B1. FIG. 8A is a schematic view of time-series data on a total amount A1+B1 of output currents of two pairs of the electrode layers 223, 233 of the second photoelectric conversion element 20. FIG. 8B is a schematic view of time-series data on output currents A1, B1 of each of two pairs of the electrode layers 223, 233 of the second photoelectric conversion element 20. In FIGS. 8A and 8B, currents become maximum when a center Rc of an irradiation region R of incident light passes through the center of the high-sensitive part 21 in the X direction. Thus, an X position (coordinates) of incident light (e.g. an X position of the center Rc of an irradiation region R of incident light) on the light receiving surface of the second photoelectric conversion element 20 at a scan start time point t1 is known from one period T1 when incident light makes one back-and-forth motion on the light receiving surface of the second photoelectric conversion element 20, and from a time T2 from the scan start time point t1 to a maximum current time point t2. In FIG. 8B, a ratio A1:B1 of currents is approximately 50:50 when the center Rc of the irradiation region R of incident light is located in the center in the Y direction, and the ratio A1:B1 of currents substantially linearly changes as the center Rc of the irradiation region R of incident light shifts from the center in the Y direction toward the electrode layers 223, 233. Thus, the Y position (coordinates) of the incident light on the light receiving surface of the second photoelectric conversion element 20 (e.g. the Y position of the center Rc of an irradiation region R of the incident light) is known from the ratio A1:B1 of currents, particularly, the ratio A1:B1 of currents at the maximum current time point t2.

Thus, the calculator 40 calculates and detects the X position (coordinates) of incident light on the light receiving surface of the second photoelectric conversion element 20 at the scan start time point t1 from the one period T1, and from the time T2 from the scan start time point t1 to the maximum current time point t2, based on the time-series data on the total amount A1+B1 of the currents shown in FIG. 8A. The calculator 40 may calculate and detect the X position (coordinates) of incident light on the light receiving surface of the second photoelectric conversion element 20 at the scan start time point t1 from the one period T1, and from the time T2 from the scan start time point t1 to the maximum current time point t2, based on one of a current A1 and a current B1 shown in FIG. 8B, instead of the time-series data on the total amount A1+B1 of the currents shown in FIG. 8A. The calculator 40 calculates and detects the Y position (coordinates) of incident light on the light receiving surface of the second photoelectric conversion element 20 from the ratio A1:B1 of currents, particularly, the ratio A1:B1 of currents at the maximum current time point t2, based on the time-series data on each of the currents A1, B1 shown in FIG. 8B.

The calculator 40 refers to the table stored in the storage 30 and obtains and detects the spot size of the incident light on the light receiving surface of the second photoelectric conversion element 20 corresponding to the total amount of the currents output from four pairs of the electrode layers 123 (133) of the first photoelectric conversion element 10 (i.e. the intensity (total amount) of the incident light on the first photoelectric conversion element 10) and the total amount of the maximum currents output from the two pairs of the electrode layers 223, 233 of the second photoelectric conversion element 20 (i.e. the intensity of the incident light on the high-sensitive part 21 of the second photoelectric conversion element 20) at the maximum current time point t2 shown in FIG. 8A, and the position (a distance in the Z direction) of the subject in the Z direction (depth).

The calculator 40 obtains an incident direction of the incident light from the XY position (coordinates) of the incident light on the light receiving surface of the first photoelectric conversion element 10 and the XY position (coordinates) of the incident light on the light receiving surface of the second photoelectric conversion element 20, and detects the three-dimensional position of the subject from the obtained incident direction of the incident light and the position (i.e. a distance in the Z direction) in the Z direction (depth).

As described above, the first photoelectric conversion element 10 generates a current corresponding to the intensity (total amount) of incident light incident on the light receiving surface in the photoelectric conversion device 1 according to this embodiment. The first photoelectric conversion element 10 distributes and outputs the generated current to four pairs of the electrode layers 123, 133 arranged on the four sides according to the XY position (coordinates) of the center of the incident light on the light receiving surface (XY plane). The second photoelectric conversion element 20 generates a current corresponding to the intensity of incident light incident on the high-sensitive part 21 on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to two pairs of the electrode layers 223, 233 arranged on the two opposite sides according to the XY position (coordinates) of the center of the incident light on the light receiving surface (XY plane).

The scan control unit 70 controls the scan mirror 60, and moves incident light on the light receiving surface of the second photoelectric conversion element 20 (scans the light receiving surface of the second photoelectric conversion element 20 with incident light) in such a way that the incident light moves back and forth in a direction intersecting the strip-like pattern of the high-sensitive part 21 on the light receiving surface of the second photoelectric conversion element 20.

The calculator 40 calculates and detects the intensity (total amount) of the incident light according to the total amount of the currents output from the four pairs of the electrode layers 123, 133 of the first photoelectric conversion element 10.

The calculator 40 also calculates and detects the XY position (coordinates) of the incident light on the light receiving surface of the first photoelectric conversion element 10 based on a ratio of the currents respectively output from the four pairs of the electrode layers 123, 133 of the first photoelectric conversion element 10. The calculator 40 also calculates and detects the XY position (coordinates) of the incident light on the light receiving surface of the second photoelectric conversion element 20 based on time-series data on currents output from two pairs of the electrode layers 223 (233) of the second photoelectric conversion element 20 when the light receiving surface of the second photoelectric conversion element 20 is scanned with the incident light by the scan control unit 70. The calculator 40 calculates and detects the incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four pairs of the electrode layers 123, 133 of the first photoelectric conversion element 10 (i.e. the intensity (total amount) of the incident light on the first photoelectric conversion element 10) and the total amount of the maximum currents output from the two pairs of the electrode layers 223, 233 of the second photoelectric conversion element 20 (i.e. the intensity of the incident light on the high-sensitive part of the second photoelectric conversion element 20) at the maximum current time point t2 shown in FIG. 8A, and the position (i.e. a distance in the Z direction) of the subject in the Z direction (depth).

Thus, the calculator 40 detects the three-dimensional position of the subject from the obtained incident direction of the incident light and the position (i.e. a distance in the Z direction) in the Z direction (depth).

The second photoelectric conversion element 20 is provided with a plurality of electrode layers 223 (233) for outputting currents, and the plurality of electrode layers 223 (233) are separately arranged on two longitudinal sides of the strip-like pattern of the first sensitive region of the second photoelectric conversion element 20. Thus, the principal surface of the second photoelectric conversion element 20 is an XY plane, a direction orthogonal to the XY plane is a Z direction, and the scan control unit 70 (the scanning unit) performs scanning in an X direction intersecting a Y direction which is a longitudinal direction of the strip-like pattern of the first sensitive region, in which case the calculator 40 can obtain the position of a light source of incident light in the X direction based on a time from the scan start time point t1 during scanning by the scan control unit (the scanning unit) 70 to the maximum output current time point t2 of the second photoelectric conversion element 20, obtain the position of the light source of the incident light in the Y direction based on a ratio between an output current of the electrode layers 223 (233) on one of the two sides of the second photoelectric conversion element 20, and an output current of the electrode layers 223 (233) on the other side, and obtain the position of the light source of the incident light in the Z direction based on the spot size of the incident light in the second photoelectric conversion element 20.

According to the photoelectric conversion device 1 of this embodiment, even if the irradiation region R of incident light on the light receiving surface of the second photoelectric conversion element 20 is out of the high-sensitive part 21, the scan control unit 70 enables the incident light to be detected by scanning the light receiving surface of the second photoelectric conversion element 20 with the incident light, and a detection region can be substantially enlarged.

Modification of First Embodiment

Although the second photoelectric conversion element 20 in which the passivation layer 230, the n-type semiconductor layer 231 and the transparent electrode layer 232 are not formed on the back surface sides of the low-sensitive parts 22 is illustrated in this embodiment, there is no limitation to this. The second photoelectric conversion element 20 may be formed such that a passivation layer, a conductivity type semiconductor layer and a transparent electrode layer are not formed on at least one of the light receiving surface side and the back surface side of the low-sensitive part 22. In other words, strip-like pattern(s) in the high-sensitive part 21 (high-sensitive region) may be formed on at least one of the light receiving surface side and the back surface side of the second photoelectric conversion element 20.

For example, contrary to the aforementioned embodiment, strip-like pattern(s) of the high-sensitive part 21 (high-sensitive region) may be formed on the light receiving surface side of the second photoelectric conversion element 20. More specifically, the passivation layer 230, the n-type semiconductor layer 231 and the transparent electrode layer 232 are formed in the high-sensitive region on the back surface side of the high-sensitive part 21 and in the low-sensitive regions on the back surface sides of the low-sensitive parts 22, and the passivation layer 220, the conductivity type semiconductor layer 221 and the transparent electrode layer 222 are formed in the high-sensitive region on the light receiving surface side of the high-sensitive part 21. On the other hand, the passivation layer 220, the conductivity type semiconductor layer 221 and the transparent electrode layer 222 are not formed in the low-sensitive regions on the light receiving surface sides of the low-sensitive parts 22. Since the recombination of carriers increases on the light receiving surface sides, where light is more absorbed, in the low-sensitive parts 22 in this case, a sensitivity difference between the high-sensitive part 21 and the low-sensitive parts 22 particularly with respect to a short wavelength region of the incident light becomes clearer. In this case, optical characteristics (e.g. reflection characteristic) on the light receiving surface may be separately adjusted.

A transparent electrode layer may be formed or a conductivity type semiconductor layer and a transparent electrode layer may be formed in the low-sensitive parts 22 of the second photoelectric conversion element 20. Particularly, if the transparent electrode layer is formed on the light receiving surface sides of the low-sensitive regions of the second photoelectric conversion element 20 when the passivation layer is not formed, optical characteristics (e.g. reflection characteristic) on the light receiving surface side are improved.

Although the first sensitive part 21 (first sensitive region) is a high-sensitive part (high-sensitive region) and the second sensitive part 22 (second sensitive region) is a low-sensitive part (low-sensitive region) in the second photoelectric conversion element 20 in this embodiment, the arrangement may be reversed. In other words, the first sensitive part 21 (first sensitive region) may be a low-sensitive part (low-sensitive region) and the second sensitive part 22 (second sensitive region) may be a high-sensitive part (high-sensitive region) in the second photoelectric conversion element 20. In this case, the output current increases as the density of the incident light decreases, i.e. as the spot size of the incident light becomes larger.

Although one strip-like pattern passing through the center of the light receiving surface and extending in the Y direction has been illustrated as the first sensitive region of the first sensitive part 21 in the second photoelectric conversion element 20 in this embodiment, the first sensitive region of the first sensitive part 21 may be formed by two or more strip-like patterns extending in the Y direction.

In this embodiment, the light receiving surface of the second photoelectric conversion element 20 is relatively scanned with the incident light by controlling the scan mirror 60 by the scan control unit 70 and moving the incident light. However, the light receiving surface of the second photoelectric conversion element 20 may be relatively scanned with the incident light by moving the second photoelectric conversion element 20 by the scan control unit 70. In this instance, the second photoelectric conversion element 20 may be translated along the principal surface, the principal surface may be tilted, or the second photoelectric conversion element 20 may be rotated along the principal surface.

Second Embodiment

In the first embodiment, the intensity (total amount) of incident light is detected by using the first photoelectric conversion element 10. In a second embodiment, the first photoelectric conversion element 10 is not used, and a photoelectric conversion element which can also detect the intensity (total amount) of incident light is used as a second photoelectric conversion element.

Figure 9:
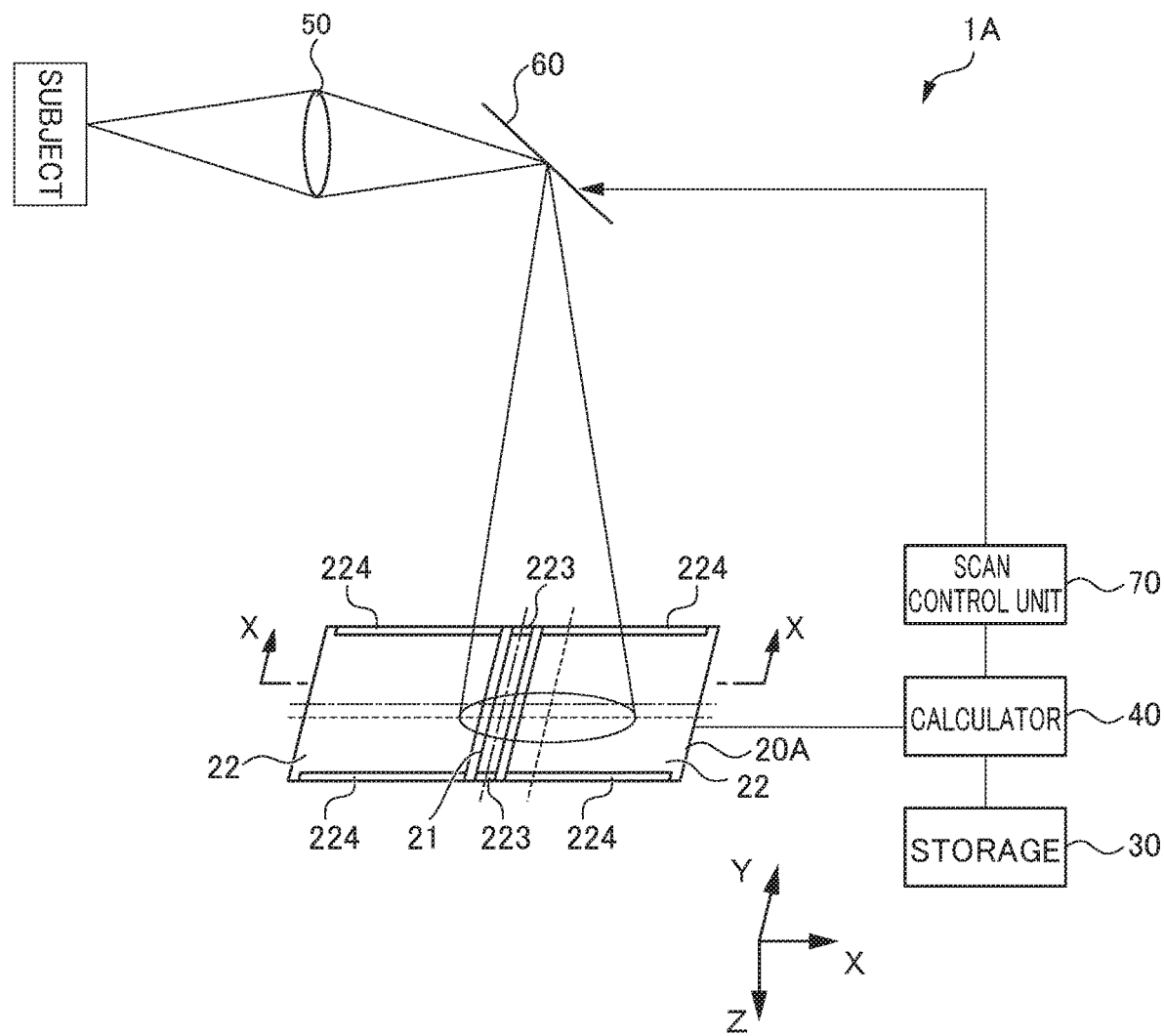
FIG. 9 is a view showing the configuration of a photoelectric conversion device (three-dimensional sensor) according to a second embodiment.

FIG. 9 is a view showing the configuration of a photoelectric conversion device according to the second embodiment. A photoelectric conversion device 1A shown in FIG. 9 is different from the first embodiment in the configuration which is not provided with the first photoelectric conversion element 10 in the photoelectric conversion device 1 shown in FIG. 1 and which includes a photoelectric conversion element 20A instead of the second photoelectric conversion element 20. In the photoelectric conversion device 1A, data stored in a storage 30, and the function and operation of a calculator 40 are different from those in the photoelectric conversion device 1.

<Configuration of Photoelectric Conversion Element>

Figure 10:
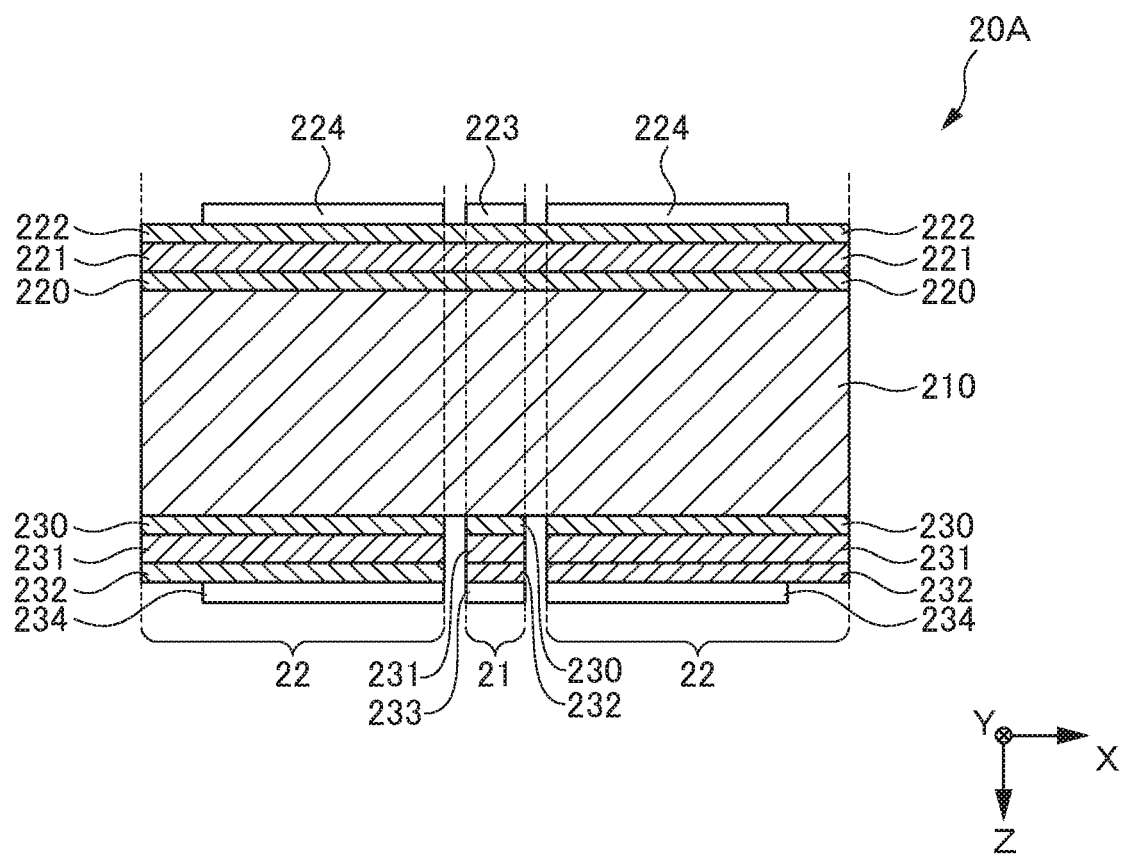
FIG. 10 is a sectional view along line X-X in a photoelectric conversion element of FIG. 9.
Figure 11:
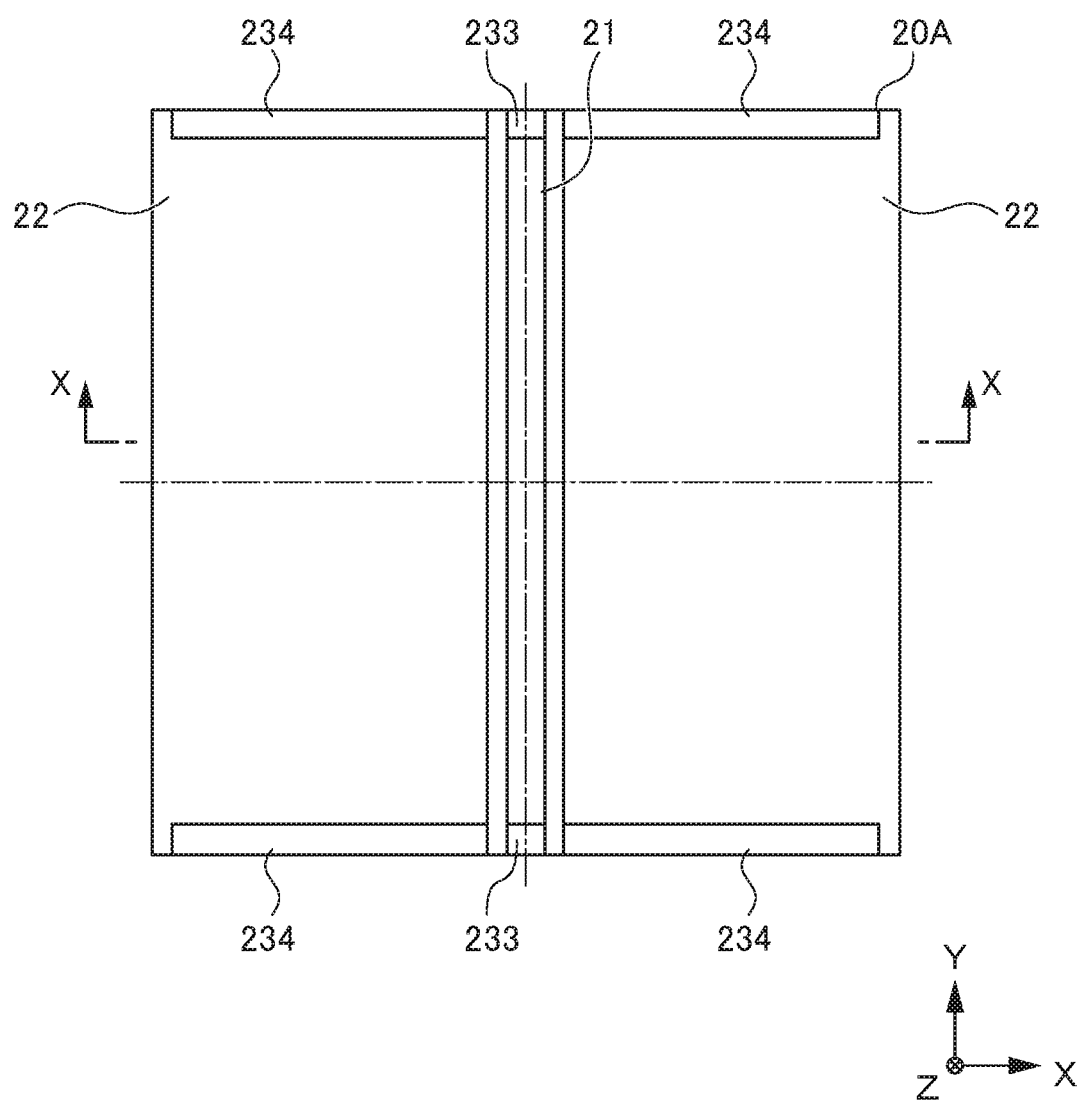
FIG. 11 is a view showing layers on the back surface side of a semiconductor substrate of the photoelectric conversion element of FIGS. 9 and 10 from the light receiving surface side.

FIG. 10 is a sectional view along line X-X in the photoelectric conversion element 20A of FIG. 9. FIG. 11 is a view showing layers 230, 231, 232 on the back surface side of a semiconductor substrate 210 of the photoelectric conversion element 20A of FIGS. 9 and 10 from the light receiving surface side. The photoelectric conversion element 20A is different from the second photoelectric conversion element 20 shown in FIG. 3 in being provided with a first sensitive part 21 and a second sensitive part 22 which are both highly sensitive and are separated.

As shown in FIG. 10, the photoelectric conversion element 20A is provided with an n-type (second conductivity type) semiconductor substrate (photoelectric conversion substrate) 210, and a passivation layer 220, a p-type (first conductivity type) semiconductor layer 221, a transparent electrode layer 222, an electrode layer (first electrode) 223 and an electrode layer (second electrode) 224 successively laminated on the light receiving surface side of the semiconductor substrate 210. The photoelectric conversion element 20A is also provided with a passivation layer 230, an n-type (second conductivity type) semiconductor layer 231, a transparent electrode layer 232, an electrode layer (first electrode) 233 and an electrode layer (second electrode) 234 successively laminated in a first specific region and a second specific region on the back surface side of the semiconductor substrate 210.

A laminated part in this first specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a first sensitive part 21. A laminated part in the second specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a second sensitive part 22.

The passivation layer 220, the p-type semiconductor layer 221 and the transparent electrode layer 222 are successively and continuously formed on the whole light receiving surface on the light receiving surface side of the semiconductor substrate 210. On the other hand, the passivation layer 230, the n-type semiconductor layer 231 and the transparent electrode layer 232 are successively formed on the back surface side of the semiconductor substrate 210 separately into the first sensitive part 21 and the second sensitive part 22 on the back surface.

Two electrode layers 223 are independently formed on the transparent electrode layer 222, i.e. on the respective two opposite sides of the first sensitive part 21 on the light receiving surface side of the semiconductor substrate 210, and two electrode layers 233 are independently formed on the transparent electrode layer 232, i.e. on the respective two opposite sides of the first sensitive part 21 on the back surface side of the semiconductor substrate 210. Four electrode layers 224 are independently formed on the transparent electrode layer 222, i.e. on the respective two opposite sides of the second sensitive part 22 on the light receiving surface side of the semiconductor substrate 210, and four electrode layers 234 are independently formed on the transparent electrode layer 232, i.e. on the respective two opposite sides of the second sensitive part 22 on the back surface side of the semiconductor substrate 210.

As shown in FIGS. 10 and 11, the photoelectric conversion element 20A has the first sensitive part 21 and the second sensitive parts 22. Sensitive regions appearing on the both principal surfaces (light receiving surface and back surface) of the semiconductor substrate 210 in the first sensitive part 21 are first sensitive regions, and sensitive regions appearing on the both principal surfaces of the semiconductor substrate 210 in the second sensitive parts 22 are second sensitive regions.

As shown in FIGS. 10 and 11, the passivation layer 230, the n-type semiconductor layer 231 and the transparent electrode layer 232 formed on the back surface side of the semiconductor substrate 210 are separated between the first sensitive part 21 and the second sensitive part 22. On the other hand, the passivation layer 220, the p-type semiconductor layer 221 and the transparent electrode layer 222 formed on the light receiving surface side of the semiconductor substrate 210 continue between the first sensitive part 21 and the second sensitive part 22. In other words, the passivation layer 220, the p-type semiconductor layer 221 and the transparent electrode layer 222 are formed on the whole light receiving surface side of the semiconductor substrate 210. Thus, optical characteristics (e.g. reflection characteristic) become uniform on the light receiving surface side.

The photoelectric conversion characteristic (sensitivity) of the first sensitive part 21 may be the same or different from the photoelectric conversion characteristic (sensitivity) of the second sensitive part 22.

Figure 12:
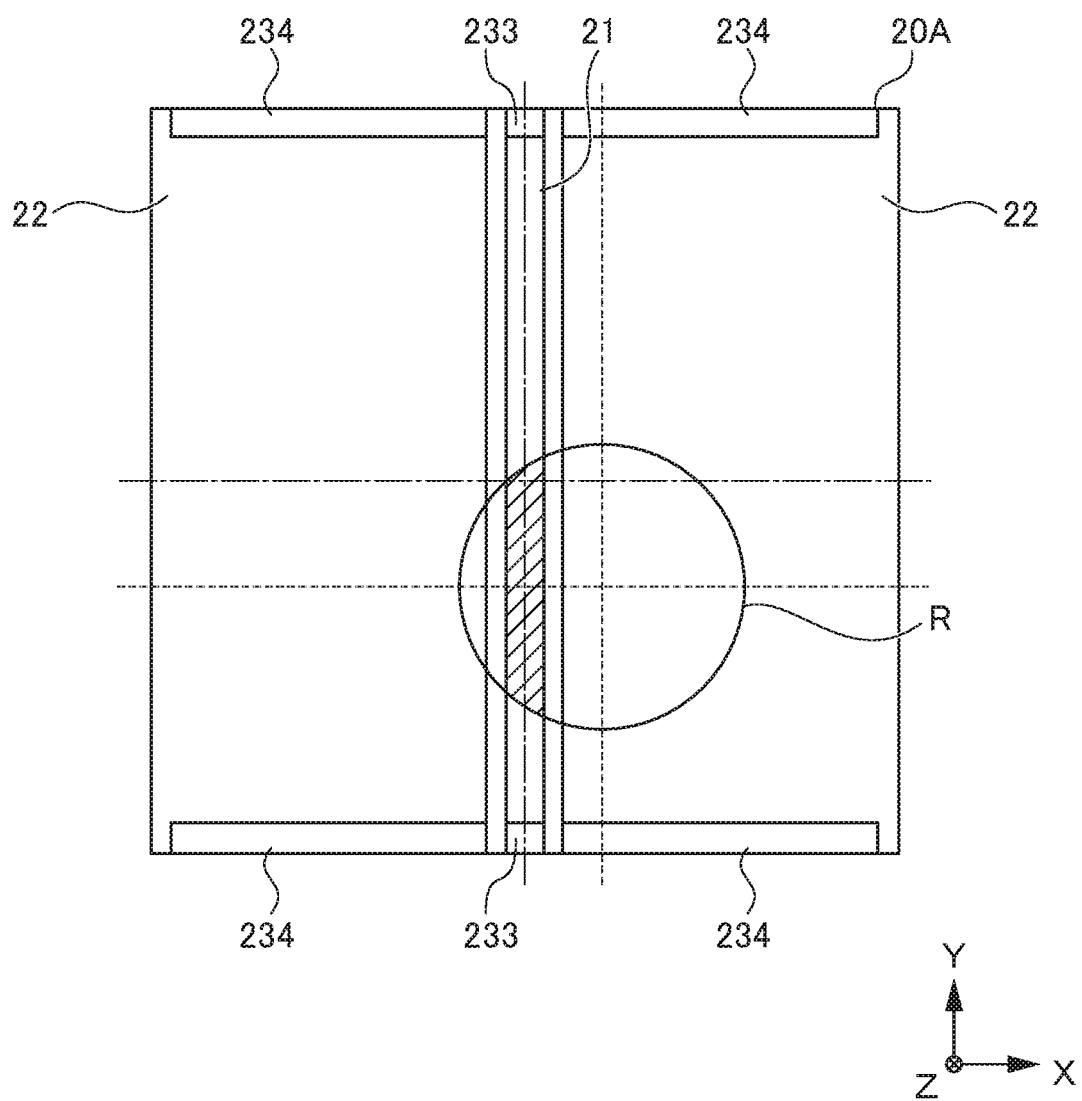
FIG. 12 is a view showing a state where incident light is incident on the photoelectric conversion element of FIG. 11.

The first sensitive region on the back surface side of the first sensitive part 21 forms strip-like patterns passing through the center of the light receiving surface and extending in the Y direction. The strip-like patterns in the first sensitive region of the first sensitive part 21 have a constant width. Thus, as the irradiation region R irradiated with the incident light on the light receiving surface increases (i.e. as the density of the incident light decreases) as shown in FIG. 12, a ratio of the first sensitive part 21 (first sensitive region) to the second sensitive parts 22 (second sensitive regions) in the irradiation region R becomes smaller. Therefore, an output current of the first sensitive part 21 decreases as the spot size of the incident light on the light receiving surface increases.

With such a configuration, the photoelectric conversion element 20A generates a current corresponding to the intensity of incident light incident on the first sensitive part 21. The photoelectric conversion element 20A distributes and outputs the current generated in the first sensitive part 21 to two pairs of the electrode layers 223, 233 arranged on the two opposite sides according to a center position (coordinates) (hereinafter, also referred to as an XY position) of the incident light on the light receiving surface (XY plane). The photoelectric conversion element 20A generates a current corresponding to the intensity of incident light incident on the second sensitive part 22. The photoelectric conversion element 20A distributes and outputs the current generated in the second sensitive part 22 to four electrode layers 224, 234 arranged on the two opposite sides according to a center position (coordinates) (hereinafter, also referred to as an XY position) of the incident light on the light receiving surface (XY plane).

Thus, the photoelectric conversion element 20A generates a current corresponding to the intensity (total amount) of incident light as the sum of the currents of two pairs of the electrode layers 223, 233 of the first sensitive part 21 and the currents of four pairs of the electrode layers 224, 234 of the second sensitive part 22. The photoelectric conversion element 20A generates a current corresponding to the Y position (coordinates) of the incident light on the light receiving surface for each of the two pairs of the electrode layers 223, 233 of the first sensitive part 21. The photoelectric conversion element 20A generates a current corresponding to the Y position (coordinates) of the incident light on the light receiving surface for each of the four pairs of the electrode layers 224, 234 of the second sensitive part 22. The photoelectric conversion element 20A generates a current corresponding to the density of the incident light, i.e. a current corresponding to the spot size of the incident light as the sum of the currents of two pairs of the electrode layers 223, 233 of the first sensitive part 21.

In this embodiment, the storage 30 stores in advance a table associating output currents (total amounts) of the first sensitive part 21 and the second sensitive part 22 of the photoelectric conversion element 20A (i.e. the intensity (total amount) of incident light on the photoelectric conversion element 20A) and an output current (total amount) of the first sensitive part 21 of the photoelectric conversion element 20A (i.e. the intensity of the incident light on the first sensitive part 21 of the photoelectric conversion element 20A) with the spot size of the incident light on the light receiving surface of the photoelectric conversion element 20A, and further associating the position (i.e. a distance in the Z direction) of the subject in the Z direction (depth) with this spot size.

<Functions and Operations of Scan Control Unit and Calculator>

Figure 13:
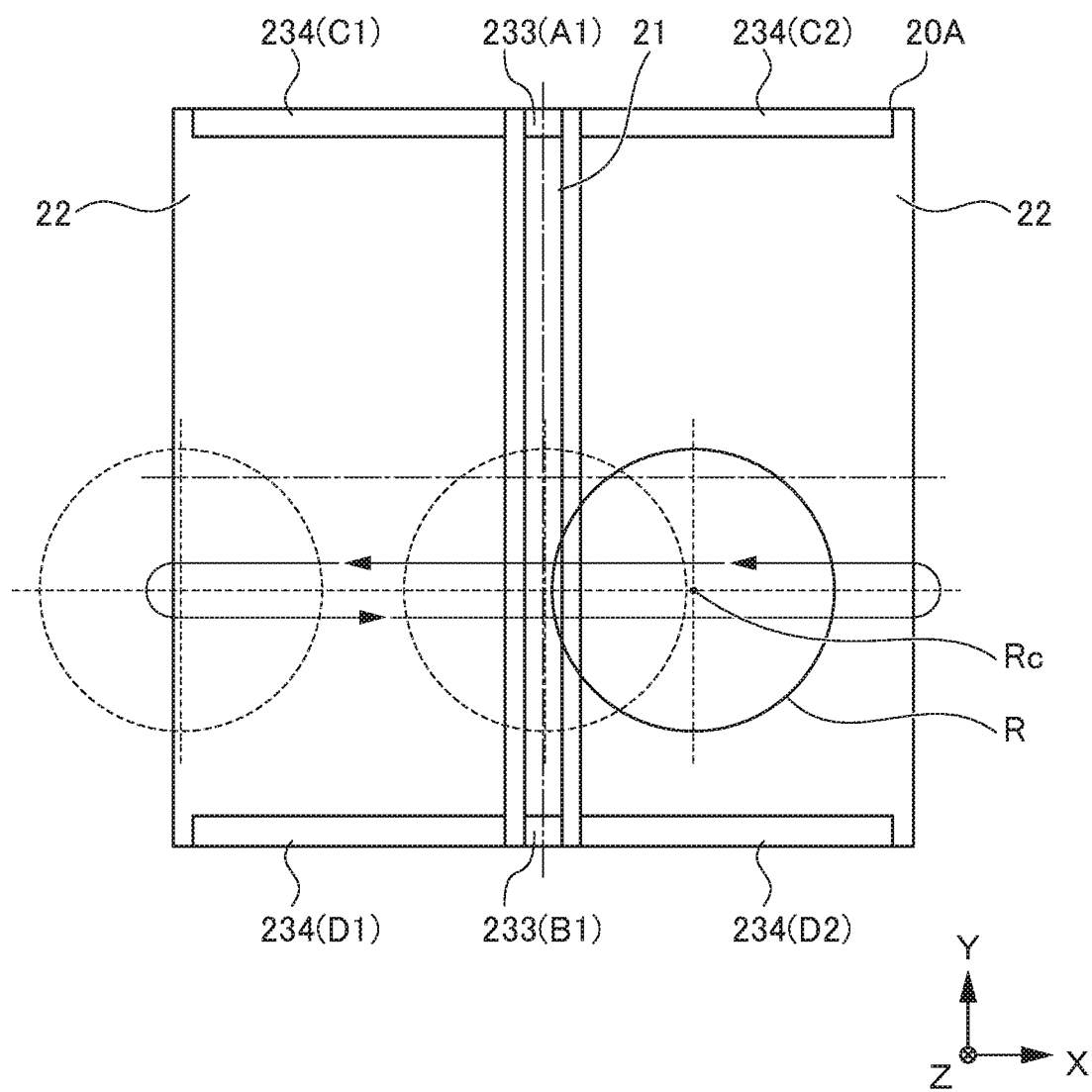
FIG. 13 is a schematic view of scanning of the light receiving surface of the photoelectric conversion element with the incident light by a scan control unit in FIG. 9.

The scan control unit 70 controls the scan mirror 60, and scans the light receiving surface of the photoelectric conversion element 20A with incident light in such a way that the incident light moves back and forth in the X direction, i.e. in a direction (arrow direction) longitudinally intersecting the strip-like pattern of the first sensitive part 21 on the light receiving surface of the photoelectric conversion element 20A as shown in FIG. 13. In this instance, the calculator 40 obtains time-series data on currents output from two pairs of the electrode layers 223, 233 of the first sensitive part 21 of the photoelectric conversion element 20A, and time-series data on currents output from the four pairs of the electrode layers 224, 234 of the second sensitive part 22. The obtained data may be temporarily stored in, for example, the storage 30.

For example, output currents of the two pairs of the electrode layers 223, 233 of the first sensitive part 21 of the photoelectric conversion element 20A are A1, B1, and output currents of the four pairs of the electrode layers 224, 234 of the second sensitive part 22 are C1, C2, D1, D2. In this case, the time-series data on the total amount A1+B1 of the output currents of the two pairs of the electrode layers 223, 233 of the first sensitive part 21 are represented as FIG. 8A described above, and the time-series data on the output currents A1, B1 of each of two pairs of the electrode layers 223, 233 of the first sensitive part 21 are represented as FIG. 8B described above.

Thus, the calculator 40 calculates and detects the X position (coordinates) of incident light on the light receiving surface of the photoelectric conversion element 20A at the scan start time point t1 from the one period T1, and from the time T2 from the scan start time point t1 to the maximum current time point t2, based on the time-series data on the total amount A1+B1 of the currents shown in FIG. 8A. The calculator 40 may calculate and detect the X position (coordinates) of incident light on the light receiving surface of the photoelectric conversion element 20A at the scan start time point t1 from the one period T1, and from the time T2 from the scan start time point t1 to the maximum current time point t2, based on one of a current A1 and a current B1 shown in FIG. 8B, instead of the time-series data on the total amount A1+B1 of the currents shown in FIG. 8A. The calculator 40 calculates and detects the Y position (coordinates) of incident light on the light receiving surface of the photoelectric conversion element 20A from the ratio A1:B1 of currents, particularly, the ratio A1:B1 of currents at the maximum current time point t2, based on the time-series data on each of the currents A1, B1 shown in FIG. 8B. The calculator 40 may calculate and detect the Y position (coordinates) of incident light on the light receiving surface of the photoelectric conversion element 20A from the ratio C1:D1 (or C2:D2) of currents, particularly, the ratio C1:D1 (or C2:D2) of currents at the maximum current time point t2, based on the time-series data on each of the output currents C1, D1 (or C2, D2) of the second sensitive part 22.

The calculator 40 calculates and detects the total amount of the output currents A1, B1 of the first sensitive part 21 at the maximum current time point t2 and the output currents C1, C2, D1, D2 of the second sensitive part 22 as the intensity (total amount) of incident light, based on the time-series data on the total amount A1+B1 of the currents shown in FIG. 8A.

The calculator 40 refers to the table stored in the storage 30 and obtains and detects the spot size of the incident light on the light receiving surface of the photoelectric conversion element 20A corresponding to the total amount of the currents output from six pairs of the electrode layers 223, 233, 224, 234 of the photoelectric conversion element 20A, for example, at the maximum current time point t2 shown in FIG. 8A (i.e. the intensity (total amount) of the incident light on the photoelectric conversion element 20A) and the total amount of the maximum currents output from the two pairs of the electrode layers 223, 233 of the photoelectric conversion element 20A at the maximum current time point t2 shown in FIG. 8A (i.e. the intensity of the incident light on the first sensitive part 21 of the photoelectric conversion element 20A), and the position (i.e. a distance in the Z direction) of the subject in the Z direction (depth). Since substantially the same current can be obtained both at the maximum current time point t2 and other time points, the total amount of the currents output from six pairs of the electrode layers 223, 233, 224, 234 of the photoelectric conversion element 20A (i.e. the intensity (total amount) of the incident light on the photoelectric conversion element 20A) is not limited to the current at the maximum current time point t2. The total amount of the currents of the six pairs of the electrode layers 223, 233, 224, 234 is preferably a current total amount value measured at timing in which incident light does not overlap a gap of a non-electrode layer between the first sensitive part 21 and the second sensitive part 22.

If, for example, the XY position (coordinates) of the center of the photoelectric conversion element 20A relative to the XY position (coordinates) of the center of an optical lens 50 is known in advance, the calculator 40 obtains an incident direction of the incident light from the XY position (coordinates) of the center of an optical lens 50 and the XY position (coordinates) of the incident light on the light receiving surface of the photoelectric conversion element 20A, and detects the three-dimensional position of the subject from the obtained incident direction of the incident light and the position (i.e. a distance in the Z direction) in the Z direction (depth).

As described above, in the photoelectric conversion device 1A according to this embodiment, the photoelectric conversion element 20A generates a current corresponding to the intensity of incident light incident on the first sensitive part 21. The photoelectric conversion element 20A distributes and outputs the generated current to the two pairs of the electrode layers 223, 233 arranged on the two opposite sides according to the XY position (coordinates) of the center of the incident light on the light receiving surface (XY plane). The photoelectric conversion element 20A generates a current corresponding to the intensity of incident light incident on the second sensitive part 22. The photoelectric conversion element 20A distributes and outputs the generated current to the four pairs of the electrode layers 224, 234 arranged on the two opposite sides according to the XY position (coordinates) of the center of the incident light on the light receiving surface (XY plane).

Thus, the photoelectric conversion element 20A generates a current corresponding to the intensity (total amount) of incident light as the sum of the currents of two pairs of the electrode layers 223, 233 of the first sensitive part 21 and the currents of four pairs of the electrode layers 224, 234 of the second sensitive part 22. The photoelectric conversion element 20A generates a current corresponding to the Y position (coordinates) of the incident light on the light receiving surface for each of the two pairs of the electrode layers 223, 233 of the first sensitive part 21. The photoelectric conversion element 20A generates a current corresponding to the Y position (coordinates) of the incident light on the light receiving surface for each of the four pairs of the electrode layers 224, 234 of the second sensitive part 22. The photoelectric conversion element 20A generates a current corresponding to the density of the incident light, i.e. a current corresponding to the spot size of the incident light as the sum of the currents of two pairs of the electrode layers 223, 233 of the first sensitive part 21.

The scan control unit 70 controls the scan mirror 60, and scans the light receiving surface of the photoelectric conversion element 20A with incident light in such a way that the incident light moves back and forth in a direction intersecting the strip-like pattern of the first sensitive part 21 on the light receiving surface of the photoelectric conversion element 20A.

The calculator 40 calculates and detects the intensity (total amount) of the incident light according to the total amount of the currents output from the two pairs of the electrode layers 223, 233 of the first sensitive part 21 of the photoelectric conversion element 20A and the currents output from the four pairs of the electrode layers 224, 234 of the second sensitive part 22 of the photoelectric conversion element 20A.

The calculator 40 also calculates and detects the XY position (coordinates) of the incident light on the light receiving surface of the photoelectric conversion element 20A based on time-series data on currents output from two pairs of the electrode layers 223, 233 of the first sensitive part 21 of the photoelectric conversion element 20A and time-series data on currents output from four pairs of the electrode layers 224, 234 of the second sensitive part 22 when the light receiving surface of the photoelectric conversion element 20A is scanned with the incident light by the scan control unit 70.

The calculator 40 refers to the table stored in the storage 30 and obtains and detects the spot size of the incident light on the light receiving surface of the photoelectric conversion element 20A corresponding to the total amount of the currents output from six pairs of the electrode layers 223, 233, 224, 234 of the photoelectric conversion element 20A, for example, at the maximum current time point t2 shown in FIG. 8A (i.e. the intensity (total amount) of the incident light on the photoelectric conversion element 20A) and the total amount of the maximum currents output from the two pairs of the electrode layers 223, 233 of the photoelectric conversion element 20A at the maximum current time point t2 shown in FIG. 8A (i.e. the intensity of the incident light on the high-sensitive part 21 of the photoelectric conversion element 20A), and the position (i.e. a distance in the Z direction) of the subject in the Z direction (depth).

If, for example, the XY position (coordinates) of the center of the photoelectric conversion element 20A relative to the XY position (coordinates) of the center of an optical lens 50 is known in advance, the calculator 40 obtains an incident direction of the incident light from the XY position (coordinates) of the center of the optical lens 50 and the XY position (coordinates) of the incident light on the light receiving surface of the photoelectric conversion element 20A, and detects the three-dimensional position of the subject from the obtained incident direction of the incident light and the position (i.e. a distance in the Z direction) in the Z direction (depth).

The photoelectric conversion element 20A is provided with a plurality of first electrodes 223 (233) for outputting a current from the first sensitive part 21, and a plurality of second electrodes 224 (234) for outputting a current from the second sensitive part 22, and the plurality of first electrodes 223 (233) and the plurality of second electrodes 224 (234) are separately arranged on two longitudinal sides of the strip-like pattern of the first sensitive region of the photoelectric conversion element 20A. Thus, the principal surface of the photoelectric conversion element 20A is an XY plane, a direction orthogonal to the XY plane is a Z direction, and the scan control unit (the scanning unit) 70 performs scanning in an X direction intersecting a Y direction which is a longitudinal direction of the strip-like pattern of the first sensitive region, in which case the calculator 40 can obtain the position of a light source of incident light in the X direction based on a time from the scan start time point t1 during scanning by the scan control unit (the scanning unit) 70 to the maximum output current time point t2 of the first sensitive part 22 of the photoelectric conversion element 20A, obtain the position of the light source of the incident light in the Y direction based on a ratio between an output current of the first electrodes 223 (233) on one of the two sides of the photoelectric conversion element 20A, and an output current of the first electrodes 223 (233) on the other side, or a ratio between an output current of the second electrodes 224 (234) on one of the two sides of the photoelectric conversion element 20A, and an output current of the second electrodes 224 (234) on the other side, and obtain the position of the light source of the incident light in the Z direction based on the spot size of the incident light in the photoelectric conversion element 20A.

According to the photoelectric conversion device 1A of this embodiment, even if the irradiation region R of incident light on the light receiving surface of the photoelectric conversion element 20A is out of the first sensitive part 21, the scan control unit 70 enables the incident light to be detected by scanning the light receiving surface of the photoelectric conversion element 20A with the incident light, and a detection region can be substantially enlarged.

Modification of Second Embodiment

Although the passivation layer 230, the n-type semiconductor layer 231 and the transparent electrode layer 232 successively formed on the back surface side of the photoelectric conversion element 20A are separated between the first sensitive part 21 and the second sensitive part 22 in the form illustrated in this embodiment, there is no limitation to this. The photoelectric conversion element 20A may be formed such that, on at least one of the light receiving surface side and the back surface side, the passivation layer, the conductivity-type semiconductor layer and the transparent electrode layer of the first sensitive part 21 are separated from the passivation layer, the conductivity type semiconductor layer and the transparent electrode layer of the second sensitive part 22. In other words, strip-like pattern(s) in the first sensitive part 21 (first sensitive region) may be formed on at least one of the light receiving surface side and the back surface side of the photoelectric conversion element 20A.

For example, contrary to the aforementioned embodiment, strip-like pattern(s) of the first sensitive part 21 may be formed on the light receiving surface side of the photoelectric conversion element 20A. More specifically, the passivation layer 230, the n-type semiconductor layer 231 and the transparent electrode layer 232 on the back surface side of the photoelectric conversion element 20A may continue between the first sensitive part 21 and the second sensitive part 22, and the passivation layer 220, the p-type semiconductor layer 221 and the transparent electrode layer 222 on the light receiving surface side of the photoelectric conversion element 20A may be separated between the first sensitive part 21 and the second sensitive part 22. For example, strip-like pattern(s) of the first sensitive part 21 may be formed on the light receiving surface side and the back surface side of the photoelectric conversion element 20A. More specifically, the passivation layer 220, the p-type semiconductor layer 221 and the transparent electrode layer 222 on the light receiving surface side of the photoelectric conversion element 20A may be separated between the first sensitive part 21 and the second sensitive part 22, and the passivation layer 230, the n-type semiconductor layer 231 and the transparent electrode layer 232 on the back surface side of the photoelectric conversion element 20A may also be separated between the first sensitive part 21 and the second sensitive part 22. In this case, optical characteristics (e.g. reflection characteristic) on the light receiving surface may be separately adjusted.

A transparent electrode layer may be formed in a part between the first sensitive part 21 and the second sensitive part 22 of the photoelectric conversion element 20A. Particularly, if the transparent electrode layer is formed when the passivation layer 220, the p-type semiconductor layer 221 and the transparent electrode layer 222 on the light receiving surface side of the photoelectric conversion element 20A are separated, optical characteristics (e.g. reflection characteristic) on the light receiving surface side are improved.

Although one strip-like pattern passing through the center of the light receiving surface and extending in the Y direction has been illustrated as the first sensitive region of the first sensitive part 21 in the photoelectric conversion element 20A in this embodiment, the first sensitive region of the first sensitive part 21 may be formed by two or more strip-like patterns extending in the Y direction.

In this embodiment, the light receiving surface of the second photoelectric conversion element 20A is relatively scanned with the incident light by controlling the scan mirror 60 by the scan control unit 70 and scanning with the incident light. However, the light receiving surface of the second photoelectric conversion element 20A may be relatively scanned with the incident light by moving the second photoelectric conversion element 20A by the scan control unit 70. In this instance, the second photoelectric conversion element 20A may be translated along the principal surface, the principal surface may be tilted, or the second photoelectric conversion element 20A may be rotated along the principal surface.

Although the embodiments of the present disclosure have been described above, the present disclosure is not limited to the above embodiments and various modifications can be made. For example, although the hetero-junction type photoelectric conversion elements 20, 20A have been illustrated as shown in FIG. 2 in the above embodiments, the features of the present disclosure are not limited to hetero-junction type photoelectric conversion elements and are applicable to various photoelectric conversion elements such as homo-junction type photoelectric conversion elements.

In the above embodiments, p-type semiconductor layers have been illustrated as the conductivity type semiconductor layers 221 on the light receiving surface side and n-type semiconductor layers have been illustrated as the conductivity type semiconductor layers 231 on the back surface side. However, the conductivity type semiconductor layer 221 on the light receiving surface side may be an n-type semiconductor layer in which an amorphous silicon material is doped with an n-type dopant (e.g. phosphorus (P) described above), and the conductivity type semiconductor layer 231 on the back surface side may be a p-type semiconductor layer in which an amorphous silicon material is doped with a p-type dopant (e.g. boron (B) described above).

Although an n-type semiconductor substrate has been illustrated as the semiconductor substrate 210 in the above embodiments, the semiconductor substrate 210 may be a p-type semiconductor substrate in which a crystalline silicon material is doped with a p-type dopant (e.g. boron (B) described above).

Although the photoelectric conversion elements each including the crystalline silicon substrate have been illustrated in the above embodiments, there is no limitation to this. For example, the photoelectric conversion element may include a gallium arsenide (GaAs) substrate.

What is claimed is:

1. A photoelectric conversion device comprising:
a photoelectric conversion element including a photoelectric conversion substrate having first and second principal surfaces, the photoelectric conversion substrate including a first sensitive part and a second sensitive part; and
a scanner configured to relatively scan the first principal surface of the photoelectric conversion element with incident light,
wherein
the first sensitive part defines a first sensitive region on the first principal surface and the second sensitive part defines a second sensitive region on the first principal surface,
the first sensitive region is configured to receive, during scanning by the scanner, at least a portion of the incident light incident on the first principal surface in an irradiation region,
the first sensitive region forms a pattern such that a ratio of an area of the first sensitive region in the irradiation region to an area of the second sensitive region in the irradiation region decreases as a size of the irradiation region increases,
the first sensitive part and the second sensitive part of the photoelectric conversion element have different photoelectric conversion characteristics,
the photoelectric conversion substrate of the photoelectric conversion element contains a single-crystal silicon material,
the photoelectric conversion element including
a first conductivity type semiconductor layer formed at one of the first and second principal surfaces of the photoelectric conversion substrate, and
a second conductivity type semiconductor layer formed at an other of the first and second principal surfaces of the photoelectric conversion substrate,
in the photoelectric conversion element, the second sensitive part has a photoelectric conversion characteristic lower than that of the first sensitive part, and
the photoelectric conversion element further includes passivation layers formed on the first and second principal surfaces in the first sensitive part, such that the passivation layers are absent from at least one of the first and second principal surfaces in the second sensitive part.

2. The photoelectric conversion device according to claim 1, wherein
the first sensitive region of the photoelectric conversion element forms at least one strip-like pattern on the first principal surface, and
the scanner is configured to scan in a direction intersecting a longitudinal direction of the strip-like pattern.

3. The photoelectric conversion device according to claim 1, wherein
in the photoelectric conversion element, the first sensitive part further defines the first sensitive region on the second principal surface and the second sensitive part further defines the second sensitive region on the second principal surface, and
the photoelectric conversion element further comprises
a first one of the passivation layers, the first conductivity type semiconductor layer and a first transparent electrode layer successively formed at the first principal surface in the first sensitive region and the second sensitive region, and
a second one of the passivation layers, the second conductivity type semiconductor layer and a second transparent electrode layer are successively formed at the second principal surface in the first sensitive region, such that the second one of the passivation layers, the second conductivity type semiconductor layer and the second transparent electrode layer are absent from the second sensitive regionpart on the second principal surface.

4. The photoelectric conversion device according to claim 1, wherein
in the photoelectric conversion element, the first sensitive part further defines the first sensitive region on the second principal surface and the second sensitive part further defines the second sensitive region on the second principal surface, and the photoelectric conversion element further comprises
- a second one of the passivation layers, the second conductivity type semiconductor layer and a second transparent electrode layer successively formed at the second principal surface in the first sensitive region and the second sensitive region, and
- a first one of the passivation layers, the first conductivity type semiconductor layer and a first transparent electrode layer successively formed at the first principal surface in the first sensitive region, such that the first one of the passivation layers, the first conductivity type semiconductor layer and the first transparent electrode layer are absent from the second sensitive part on the first principal surface.

5. The photoelectric conversion device according to claim 1, further comprising
an other photoelectric conversion element arranged on an upstream side of the incident light, and
wherein the photoelectric conversion element is arranged on a downstream side of the incident light.

6. The photoelectric conversion device according to claim 5, further comprising
a calculator configured to calculate a spot size of the incident light on the photoelectric conversion element based on an output current of the other photoelectric conversion element and a maximum output current of the photoelectric conversion element during scanning by the scanner.

7. The photoelectric conversion device according to claim 6, wherein
the first sensitive region of the photoelectric conversion element forms at least one strip-like pattern on the first principal surface, and
the photoelectric conversion element includes a plurality of electrodes that output currents, the plurality of electrodes being separately arranged on two longitudinal sides of the strip-like pattern of the first sensitive region of the photoelectric conversion element.

8. The photoelectric conversion device according to claim 1, wherein the first sensitive part and the second sensitive part of the photoelectric conversion element are separated from each other.

9. The photoelectric conversion device according to claim 8, wherein
the first sensitive part further defines the first sensitive region on the second principal surface and the second sensitive part further defines the second sensitive region on the second principal surface, and
at at least one of the first and second principal surfaces of the photoelectric conversion substrate of the photoelectric conversion element, the first sensitive region and the second sensitive region are separated from each other.

10. The photoelectric conversion device according to claim 8, further comprising
an optical lens arranged on an upstream side of the incident light,
wherein the photoelectric conversion element is arranged on a downstream side of the incident light.

11. The photoelectric conversion device according to claim 10, further comprising
a calculator configured to calculate a spot size of the incident light on the photoelectric conversion element based on an output current of the first sensitive part and a maximum output current of the second sensitive part in the photoelectric conversion element during scanning by the scanner.

12. The photoelectric conversion device according to claim 11, wherein
the first sensitive region of the photoelectric conversion element forms at least one strip-like pattern on the first principal surface, and
the photoelectric conversion element includes
a plurality of first electrodes that output a first current from the first sensitive part, and
a plurality of second electrodes that output a second current from the second sensitive part, and
the plurality of first electrodes and the plurality of second electrodes are separately arranged on two longitudinal sides of the strip-like pattern of the first sensitive region of the photoelectric conversion element.

13. A photoelectric conversion device comprising:
a photoelectric conversion element including a photoelectric conversion substrate having first and second principal surfaces, the photoelectric conversion substrate including a first sensitive part and a second sensitive part;
a scanner configured to relatively scan the first principal surface of the photoelectric conversion element with incident light; and
an optical lens arranged on an upstream side of the incident light,
wherein
the first sensitive part defines a first sensitive region on the first principal surface and the second sensitive part defines a second sensitive region on the first principal surface,
the first sensitive region is configured to receive, during scanning by the scanner, at least a portion of the incident light incident on the first principal surface in an irradiation region,
the first sensitive region forms a pattern such that a ratio of an area of the first sensitive region in the irradiation region to an area of the second sensitive region in the irradiation region decreases as a size of the irradiation region increases,
the first sensitive part and the second sensitive part of the photoelectric conversion element are separated from each other, and
the photoelectric conversion element is arranged on a downstream side of the incident light.

* * * * *